US012660306B2

(12) United States Patent
Lee et al.

(10) Patent No.: US 12,660,306 B2
(45) Date of Patent: Jun. 16, 2026

(54) SEMICONDUCTOR DEVICE WITH GATE ISOLATION STRUCTURE

(71) Applicant: SAMSUNG ELECTRONICS CO., LTD., Suwon-si (KR)

(72) Inventors: Kyoungwoo Lee, Suwon-si (KR);
Yeonho Park, Suwon-si (KR);
Minchan Gwak, Suwon-si (KR);
Hojun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 474 days.

(21) Appl. No.: 18/125,429

(22) Filed: Mar. 23, 2023

(65) Prior Publication Data

US 2024/0063221 A1 Feb. 22, 2024

(30) Foreign Application Priority Data

Aug. 16, 2022 (KR) ......................... 10-2022-0102209

(51) Int. Cl.
H10D 84/85 (2025.01)
H01L 21/28 (2025.01)
(Continued)

(52) U.S. Cl.
CPC .......... H10D 84/85 (2025.01); H10D 30/014 (2025.01); H10D 30/43 (2025.01);
(Continued)

(58) Field of Classification Search
CPC .... H10D 84/85; H10D 30/014; H10D 62/121; H10D 64/017; H10D 84/0172;
(Continued)

(56) References Cited

U.S. PATENT DOCUMENTS 10,867,998 B1    12/2020   Hung et al.
10,868,001 B2    12/2020   Ching et al.
(Continued)

FOREIGN PATENT DOCUMENTS

KR    10-2021-0102816 A    8/2021
KR    10-2022-0070140 A    5/2022

OTHER PUBLICATIONS

Office Action dated Oct. 12, 2025, issued by Korean Patent Office in Korean Patent Application No. 10-2022-0102209.

*Primary Examiner* — Norman D Richards
*Assistant Examiner* — Colin Russell Mccutcheon
(74) *Attorney, Agent, or Firm* — Sughrue Mion, PLLC

(57) ABSTRACT

A semiconductor device includes active regions, gate structures intersecting the active regions and including gate electrodes, source/drain regions on the active regions on sides of the gate structures, and a gate isolation structure isolating gate structures, which oppose each other, from each other on a region between the active regions. The gate structures that oppose each other include a first gate structure, a second gate structure opposing the first gate structure, a third gate structure extending in parallel to the first gate structure, and a fourth gate structure opposing the third gate structure and extending in parallel to the second gate structure. The gate isolation structure includes a first isolation structure of a line type extending in the first horizontal direction, and second isolation structures of a hole type penetrating through the first isolation structure between the first and second gate structures and between the third and fourth gate structures.

20 Claims, 37 Drawing Sheets

(51) Int. Cl.

| | |
|---|---|
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2026.01) |
| *H10D 84/03* | (2025.01) |

(52) U.S. Cl.

CPC ..... *H10D 30/6729* (2025.01); *H10D 30/6735* (2025.01); *H10D 62/121* (2025.01); *H10D 64/01326* (2026.01); *H10D 64/017* (2025.01); *H10D 84/0167* (2025.01); *H10D 84/0172* (2025.01); *H10D 84/0188* (2025.01); *H10D 84/038* (2025.01)

(58) Field of Classification Search

CPC ........... H10D 84/0167; H10D 30/6735; H10D 30/43; H10D 84/038; H10D 30/6729; H10D 84/0188; H01L 21/28123

USPC ........................................................ 257/351

See application file for complete search history.

(56) References Cited

U.S. PATENT DOCUMENTS

| | | | |
|---|---|---|---|
| 10,930,749 | B2 | 2/2021 | Jeon et al. |
| 11,081,356 | B2 | 8/2021 | Wang et al. |
| 11,177,180 | B2 | 11/2021 | Wu et al. |
| 11,271,086 | B2 | 3/2022 | Lin et al. |
| 2014/0339647 | A1* | 11/2014 | Rashed ................ H10D 84/834 438/294 |
| 2020/0006075 | A1* | 1/2020 | Wang ................... H10D 62/115 |
| 2021/0249309 | A1* | 8/2021 | Wu .................... H10D 84/0158 |
| 2021/0249313 | A1 | 8/2021 | Chen et al. |

\* cited by examiner

SEMICONDUCTOR DEVICE WITH GATE ISOLATION STRUCTURE

CROSS-REFERENCE TO RELATED APPLICATION(S)

This application claims benefit of priority to Korean Patent Application No. 10-2022-0102209 filed on Aug. 16, 2022 in the Korean Intellectual Property Office, the disclosure of which is incorporated by reference herein in its entirety.

BACKGROUND

Example embodiments of the present disclosure relate to a semiconductor device.

As demand for high performance, high speed, and/or multifunctionality of a semiconductor device has increased, integration density of a semiconductor device has increased. In manufacturing a semiconductor device having a fine pattern corresponding to the trend for high integration of a semiconductor device, it may be necessary to implement patterns having a fine width or a fine spacing distance. Also, to overcome limitations of operating properties due to a reduction in a size of a planar metal oxide semiconductor field effect transistor (FET), efforts have been made to develop a semiconductor device including a FinFET having a three-dimensional channel structure.

SUMMARY

It is an aspect to provide a semiconductor device having improved production yield.

According to an aspect of one or more example embodiments, there is provided a semiconductor device comprising active regions extending in a first horizontal direction and disposed parallel to each other on a substrate; a plurality of gate structures extending in a second horizontal direction and intersecting the active regions on the substrate, the plurality of gate structures respectively including gate electrodes; source/drain regions on the active regions on at least one side of the plurality of gate structures; and a gate isolation structure that isolates gate structures of the plurality of gate structures that oppose each other in the second horizontal direction, the gate isolation structure isolating the gate structures from each other on a region between the active regions. The gate structures that oppose each other in the second horizontal direction include a first gate structure, a second gate structure opposing the first gate structure in the second horizontal direction, a third gate structure extending in parallel to the first gate structure, and a fourth gate structure opposing the third gate structure in the second horizontal direction and extending in parallel to the second gate structure. The gate isolation structure includes a first isolation structure of a line type that extends in the first horizontal direction; and second isolation structures of a hole type that penetrate through the first isolation structure between the first gate structure and the second gate structure and between the third gate structure and the fourth gate structure.

According to another aspect of one or more example embodiments, there is provided semiconductor device comprising active regions extending in a first horizontal direction and disposed parallel to each other on a substrate; a plurality of gate structures intersecting the active regions on the substrate, extending in a second horizontal direction, and including gate electrodes; source/drain regions on the active regions on at least one side of the plurality of gate structures; an interlayer insulating layer covering the source/drain regions on the substrate and covering side surfaces of the plurality of gate structures; contact plugs penetrating through the interlayer insulating layer and connected to the source/drain regions; and a gate isolation structure disposed between the active regions and isolating gate structures of the plurality of gate structures that oppose each other in the second horizontal direction, the gate isolation structure isolating the gate structures that oppose each other from each other. The gate structures that oppose each other include a first gate structure, a second gate structure opposing the first gate structure in the second horizontal direction, a third gate structure extending in parallel to the first gate structure, and a fourth gate structure opposing the third gate structure in the second horizontal direction and extending in parallel to the second gate structure. The gate isolation structure includes a first isolation structure of a line type that extends in the first horizontal direction; and second isolation structures of a hole-type that penetrate through the first isolation structure between the first gate structure and the second gate structure and between the third gate structure and the fourth gate structure. A common contact plug, among the contact plugs, includes a first portion between the first gate structure and the third gate structure, a second portion between the second isolation structures, and a third portion between the second gate structure and the fourth gate structure, each of the first portion and the third portion is connected to the source/drain regions, and a width of the second portion in the first horizontal direction is greater than a width of the first portion in the first horizontal direction or a width of the third portion in the first horizontal direction.

According to yet another aspect of one or more example embodiments, there is provided a semiconductor device comprising active regions extending in a first horizontal direction and disposed parallel to each other on a substrate; a first gate structure and a second gate structure that are spaced apart from each other in a second horizontal direction and that intersect the active regions on the substrate, each of the first gate structure and the second gate structure including a gate electrode and spacer structures extending in the second horizontal direction along both sides of the gate electrode; and a gate isolation structure between the active regions, the gate isolation structure isolating the first gate structure and the second gate structure from each other. The gate isolation structure includes a first isolation structure of a line type that extends in the first horizontal direction; and a second isolation structure of a hole type that penetrates through the first isolation structure between the first gate structure and the second gate structure. The first isolation structure includes a material different from a material of the second isolation structure, and a width of the second isolation structure in the first horizontal direction is narrower than a width of each of the first gate structure and the second gate structure in the first horizontal direction.

BRIEF DESCRIPTION OF DRAWINGS

The above and other aspects, features, and advantages will be more clearly understood from the following detailed description, taken in combination with the accompanying drawings, in which.

DETAILED DESCRIPTION

Hereinafter, various embodiments will be described as follows with reference to the accompanying drawings.

Figure 1:
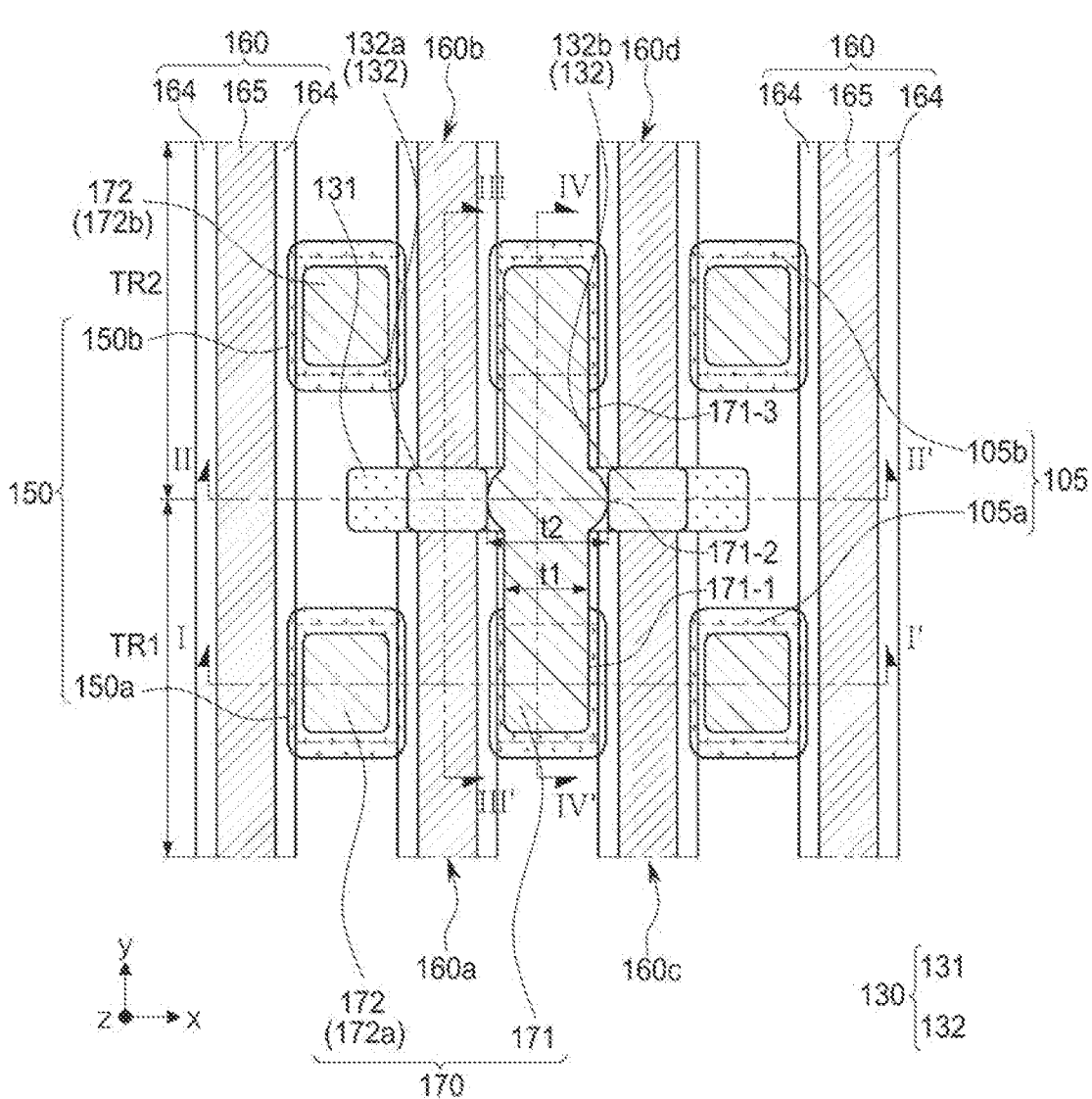
FIG. 1 is a plan diagram illustrating a semiconductor device according to some example embodiments.
Figure 2A:
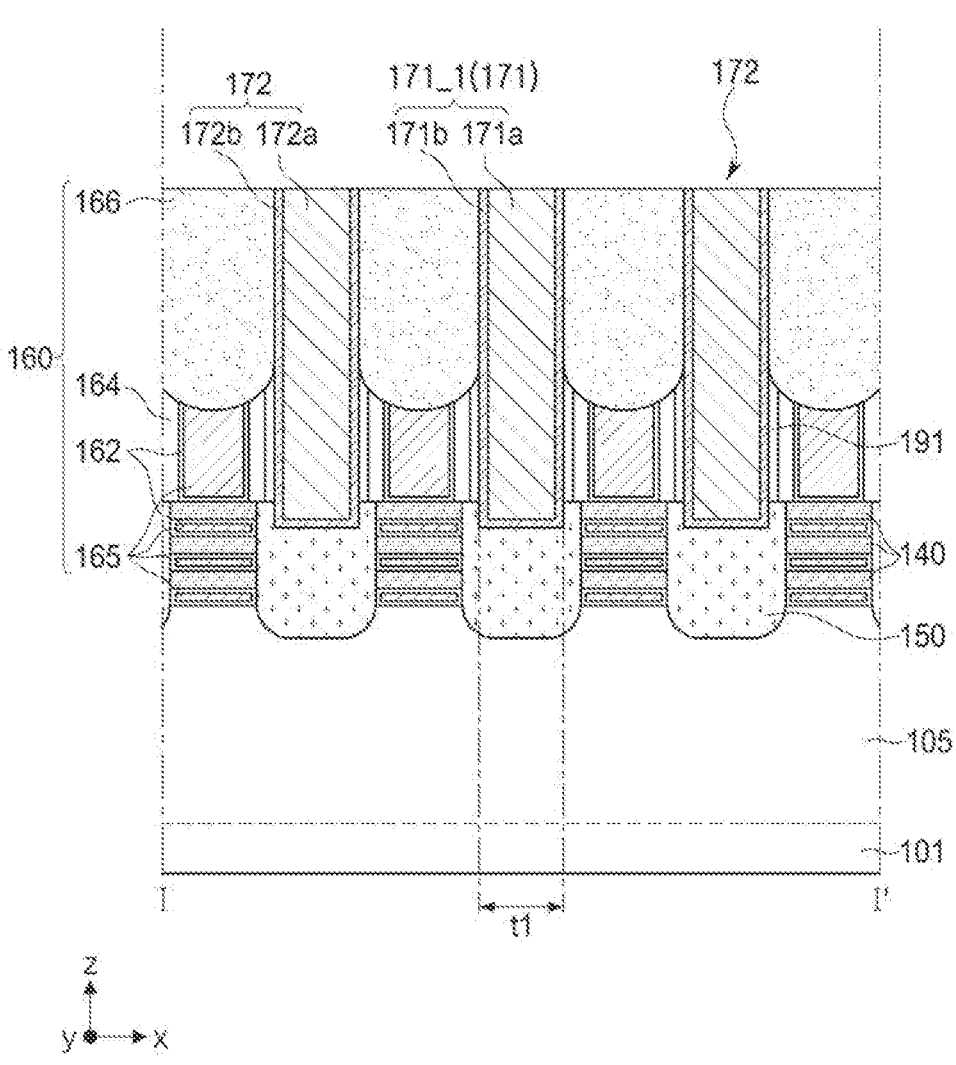
FIGS. 2A to 2D are cross-sectional diagrams illustrating a semiconductor device according to some example embodiments.
Figure 2B:
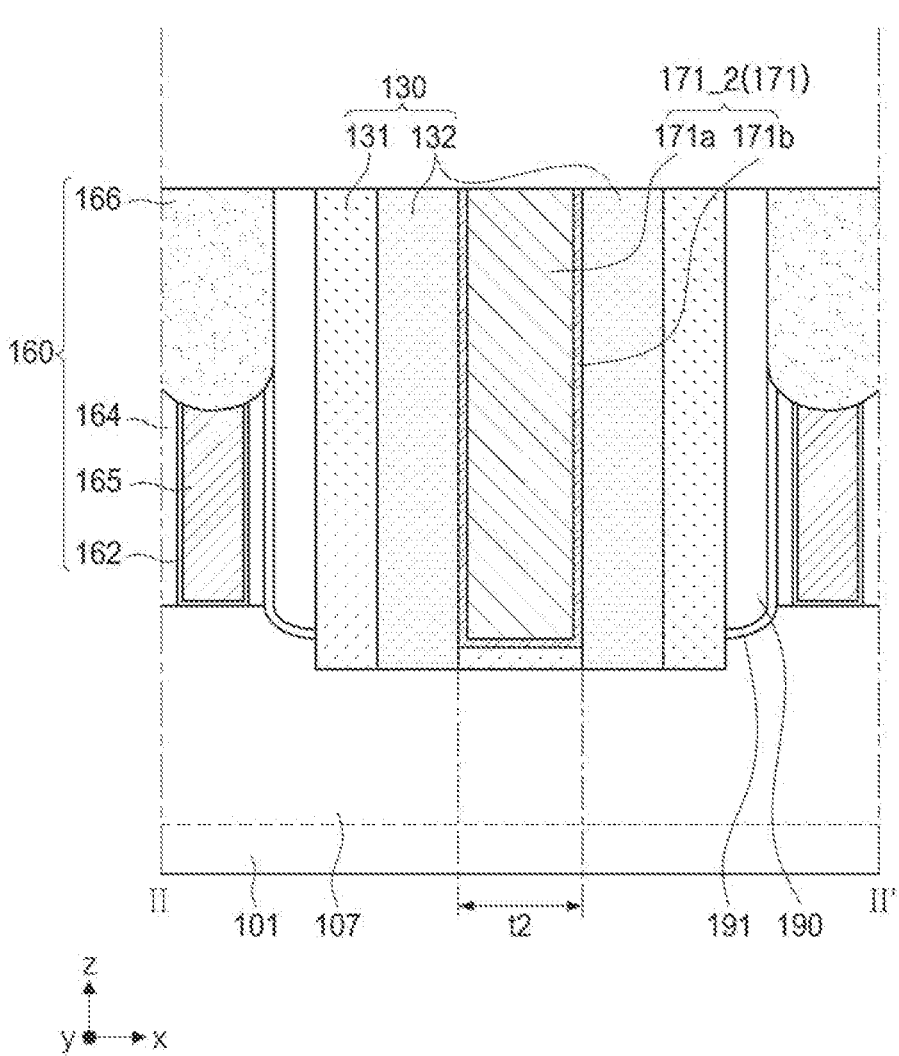
Figure 2C:
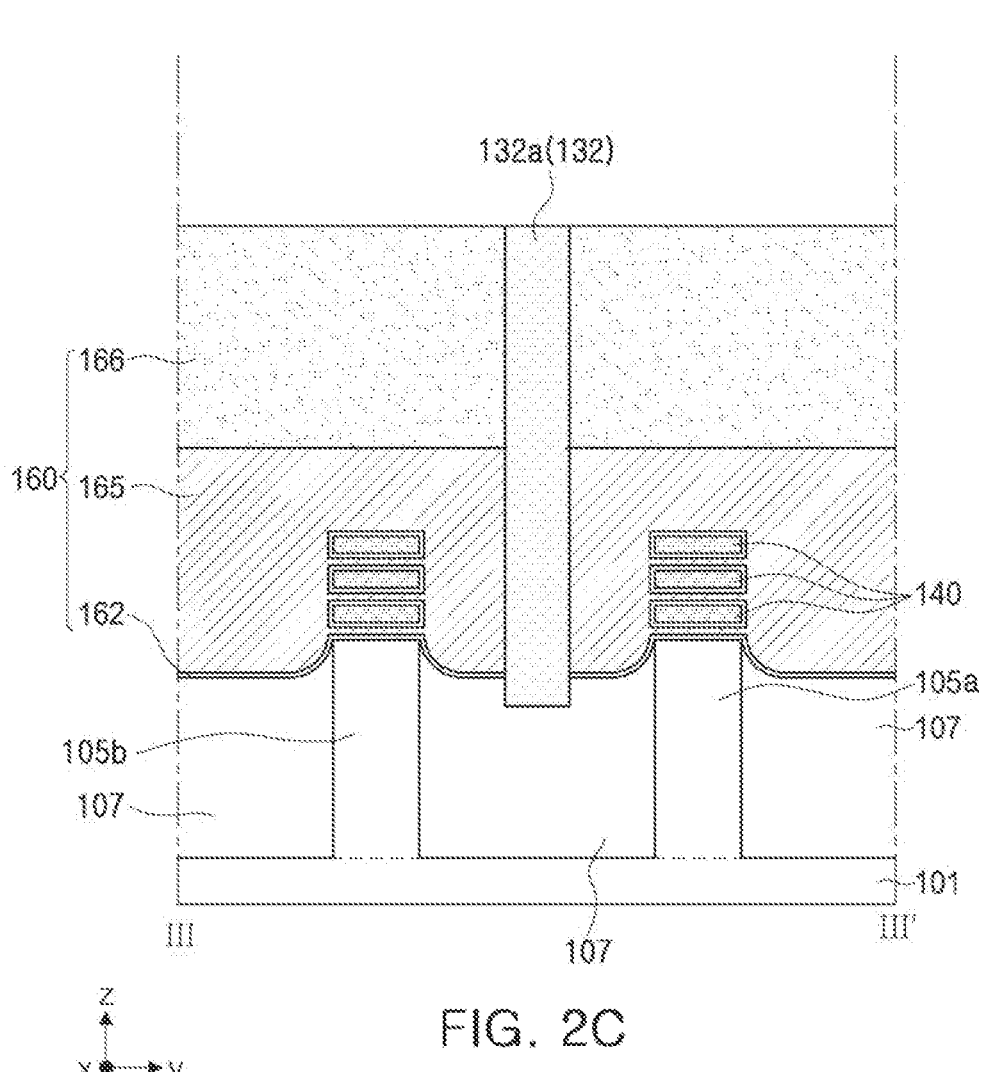
Figure 2D:
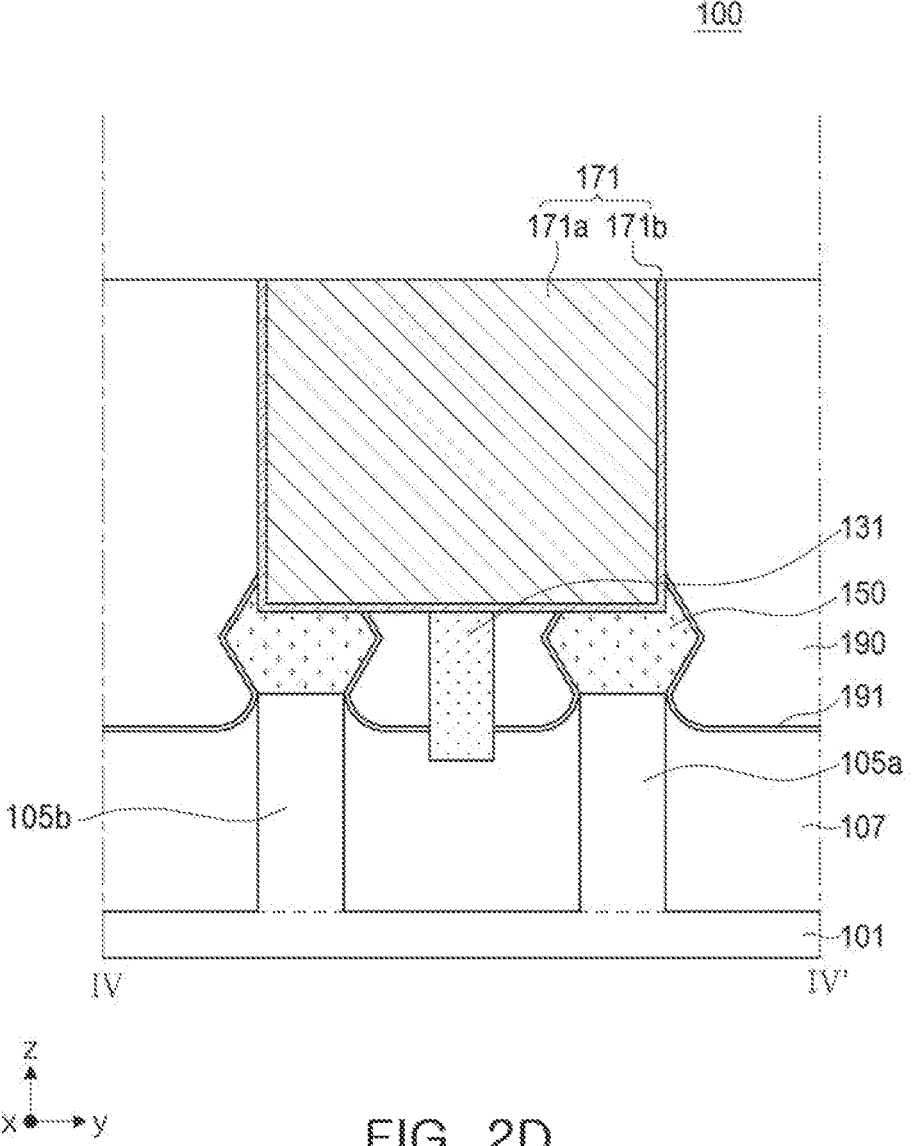

FIG. 1 is a plan diagram illustrating a semiconductor device 100 according to some example embodiments. FIGS. 2A and 2D are cross-sectional diagrams illustrating the semiconductor device 100 according to some example embodiments. FIG. 2A is a cross-sectional diagram illustrating the semiconductor device 100 in FIG. 1 taken along line I-I'. FIG. 2B is a cross-sectional diagram illustrating the semiconductor device 100 in FIG. 1 taken along line II-II'. FIG. 2C is a cross-sectional diagram illustrating the semiconductor device 100 in FIG. 1 taken along line III-III'. FIG. 2D is a cross-sectional diagram illustrating the semiconductor device 100 in FIG. 1 taken along line IV-IV'. Only major components of the semiconductor device are illustrated in FIGS. 1 to 2D for ease of understanding and conciseness.

Referring to FIGS. 1 to 2D, the semiconductor device 100 may include a substrate 101, active regions 105 on the substrate 101, device isolation layers 107 isolating the active regions 105 from each other, channel layers 140 disposed on the active regions 105, source/drain regions 150 in contact with the channel layers 140, gate structures 160 extending by intersecting the active regions 105, a gate isolation structure 130 isolating the gate structures 160 from each other, contact plugs 170, and an interlayer insulating layer 190.

The substrate 101 may have an upper surface extending in the X-direction and the Y-direction. The substrate 101 may include a semiconductor material, such as, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, an epitaxial layer, a silicon on insulator (SOI) layer, a semiconductor on insulator (SeOI) layer, or the like.

The active regions 105 may be disposed to extend in a direction parallel to the upper surface of the substrate 101, that is, for example, in the X-direction. The active regions 105 may be spaced apart from each other in the Y-direction and may be disposed in parallel to each other. The active regions 105 may protrude from an upper surface of the substrate 101 in a vertical Z-direction. The upper ends of the active regions 105 may be disposed to protrude to a predetermined height from the upper surface of the device isolation layers 107. The active regions 105 may be formed as a portion of the substrate 101, or may include an epitaxial layer grown from the substrate 101. However, the active regions 105 on the substrate 101 may be partially recessed into both sides of the gate structures 160, and the source/drain regions 150 may be disposed on the recessed active regions 105.

In some example embodiments, the active regions 105 may include a first active region 105a and a second active region 105b adjacent to each other (see, e.g., FIG. 1). Each of the first active region 105a and the second active region 105b may have a line shape or a bar shape extending in the X-direction. The first active region 105a and the second active region 105b may be spaced apart from each other and may extend in parallel to each other, but example embodiments are not limited thereto. The first active region 105a and the second active region 105b may have different conductivity types. When the first active region 105a has a first conductivity type, the second active region 105b may have a second conductivity type different from the first conductivity type. In some example embodiments, the first conductivity type may be a N-type conductivity, and the second conductivity type may be a P-type conductivity.

The device isolation layers 107 may define the active regions 105 in the substrate 101. The device isolation layers 107 may be disposed between the active regions 105. The device isolation layers 107 may have upper portions on a level lower than a level of the upper portions of the active regions 105. Accordingly, the device isolation layers 107 may partially expose the upper portions of the active regions 105. In some example embodiments, the device isolation layers 107 may have a curved upper surface that curves to have a higher level toward the active regions 105 (see, e.g., FIGS. 2C and 2D), but example embodiments are not limited thereto. The device isolation layers 107 may be formed by, for example, a shallow trench isolation (STI) process. The device isolation layers 107 may be formed of an insulating material. The device isolation layers 107 may be, for example, oxide, nitride, or a combination thereof.

The channel layers 140 may be stacked on the active regions 105 while being spaced apart from each other in the Z-direction that is perpendicular to the substrate 101. The channel layers 140 may be spaced apart from the upper surfaces of the active regions 105 while being connected to the source/drain regions 150. The channel layers 140 may have a width the same as or similar to a width of the active regions 105 in the Y-direction, and may have a width the same as or similar to a width of the gate structures 160 in the X-direction. Three channel layers 140 are illustrated in FIGS. 2A and 2C, but the number of channel layers is not limited thereto and may be varied. For example, in some example embodiments, the channel layers 140 may further include a channel layer disposed on upper surfaces of the active regions 105. The channel layers 140 may be formed of a semiconductor material, and may include, for example, at least one of silicon (Si), silicon germanium (SiGe), and germanium (Ge). In some example embodiments each of the channel layers 140 may include the same material. However, in some example embodiments, at least a portion of the channel layers 140 may include different materials.

In some example embodiments, the channel layers 140 may include first channel layers disposed on the first active region 105a and second channel layers disposed on the second active region 105b.

The source/drain regions 150 may be disposed on the active regions 105 on at least one side of the channel layers 140. The source/drain regions 150 may be disposed to cover a side surface of each of the channel layers 140, and upper surfaces of the active regions 105 on a lower end of the source/drain regions 150. The source/drain regions 150 may be in contact with the channel layers 140. The source/drain regions 150 may be disposed by being partially recessed into the upper portions of the active regions 105. However, in some example embodiments, the presence or absence of the recessed portion and the depth of the recessed portion may be varied. The source/drain regions 150 may be a semiconductor layer including silicon (Si), and may be formed of an epitaxial layer.

In some example embodiments, the source/drain regions 150 may include first source/drain regions 150a disposed on the first active region 105a and second source/drain regions 150b disposed on the second active region 105b. The first and second source/drain regions 105a and 105b may include impurities of different types and/or concentrations. For example, the first source/drain regions 150a may have the second conductivity type, and the second source/drain regions 150b may have the first conductivity type. That is, the first source/drain regions 150a and the first active region 105a may have different conductivity types.

The gate structures 160 may intersect the active regions 105 and the channel layers 140 on an upper portion of the active regions 105 and the channel layers 140 in one direction, that is, for example, the Y-direction. Channel regions of transistors may be formed in the active regions 105 and/or the channel layers 140 intersecting the gate structures 160.

Each of the gate structures 160 may include a gate dielectric layer 162, a gate electrode 165, a spacer structure 164, and a capping layer 166. Upper and bottom surfaces of portion of the gate structures 160 between the channel layers 140 may be in contact with the channel layers 140 as illustrated, for example, in FIGS. 2A and 2C.

The gate dielectric layer 162 may be disposed between each of the active regions 105 and the gate electrode 165 and between the channel layers 140 and the gate electrode 165, and may be disposed to cover at least a portion of the surfaces of the gate electrode 165. For example, the gate dielectric layer 162 may be disposed to surround an entirety of surfaces other than the upper surface of the gate electrode 165. The gate dielectric layer 162 may extend to a region between the gate electrode 165 and the spacer structure 164, but example embodiments are not limited thereto. The gate dielectric layer 162 may include an oxide, nitride, or high-k material. The high-k material may refer to a dielectric material having a higher dielectric constant than that of a silicon oxide layer ($SiO_2$). The high dielectric constant material may be, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_x O_y$), and/or praseodymium oxide ($Pr_2O_3$). In example embodiments, the gate dielectric layer 162 may include multiple layers.

The gate electrode 165 may be disposed on the active regions 105 to fill a region between the channel layers 140 and may extend to an upper portion of the channel layers 140. The gate electrode 165 may be spaced apart from the channel layers 140 by the gate dielectric layer 162. The gate electrode 165 may include a conductive material, such as, for example, a metal nitride such as titanium nitride (TiN), tantalum nitride (TaN), or tungsten nitride (WN), and/or aluminum (Al), tungsten (W), or a metal material such as molybdenum (Mo), or a semiconductor material such as doped polysilicon. In example embodiments, the gate electrode 165 may be formed of two or more multiple layers. Depending on the configuration of the semiconductor device 100, the gate electrode 165 may be disposed and may be isolated by a separator between at least a portion of the transistors adjacent to each other. The gate electrode 165 may include different materials depending on transistor regions.

The spacer structure 164 may be disposed on both sidewalls of the gate electrode 165 and may extend in the Z-direction that is perpendicular to the upper surface of the substrate 101. The width of the upper portion of each of the spacer structures 164 may include a portion smaller than the width of the lower portion. The spacer structure 164 may include an upwardly curved upper surface, as illustrated in FIGS. 2A and 2B. However, the shape of the spacer structure 164 may be varied in example embodiments. The spacer structure 164 may insulate the source/drain regions 150 from the gate electrode 165. The spacer structure 164 may be formed of multiple layers in example embodiments. The spacer structure 164 may be formed of oxide, nitride, and/or oxynitride.

The capping layer 166 may be disposed on the gate electrode 165. The capping layer 166 may be a structure for protecting the gate electrode 165 from etching in a subsequent process after forming the gate electrode 165. The capping layer 166 may be a structure supporting the contact plugs 170 and may be self-aligned in the process of forming the contact plugs 170. The capping layer 166 may be disposed on the gate electrode 165 and the spacer structure 164, and at least a portion of a lower surface thereof may be surrounded by the gate electrode 165 and the spacer structure 164. In some example embodiments, the capping layer 166 may include a lower surface having an upwardly curved shape, as illustrated in FIGS. 2A and 2B. The lower surface of the capping layer 166 may cover the gate electrode 165 and the spacer structure 164. The lower capping layer 166 may include a silicon nitride or silicon nitride-based insulating material.

In some example embodiments, the semiconductor device 100 may further include internal spacer layers disposed in parallel with the gate electrode 165 between the channel layers 140. The gate electrode 165 disposed below the uppermost one of the channel layers 140 may be electrically isolated from the source/drain regions 150 by the internal spacer layers. The internal spacer layers may have a shape in which a side surface opposing the gate electrode 165 may be inwardly curvedly rounded, rounded toward the gate electrode 165, but example embodiments are not limited thereto. The internal spacer layers may be formed of oxide, nitride, or oxynitride, and in particular, a low-K film. In some example embodiments, the internal spacer layers may be omitted.

In some example embodiments, the gate structures 160 may include a first gate structure 160a, a second gate structure 160b opposing the first gate structure 160a in the Y-direction, a third gate structure 160c extending in parallel to the first gate structure 160a, a fourth gate structure 160d opposing the gate structure 160c in the Y-direction and extending in parallel to the second gate structure 160b.

The first gate structure 160a may be physically isolated from and electrically isolated from the second gate structure 160b, and the third gate structure 160c may be physically isolated from and may be electrically isolated from the fourth gate structure 160d.

The gate isolation structure 130 may isolate the gate structures 160 from each other. The lower surfaces of the gate isolation structure 130 may be disposed on a level lower than a level of the lower surfaces of the gate structures 160 (see, e.g., FIGS. 2B and 2C). The gate isolation structure 130 may isolate the first and second gate structures 160a and 160b from each other and may isolate the third and fourth gate structures 160c and 160d from each other.

In some example embodiments, the gate isolation structure 130 may isolate two pairs of opposing gate structures from each other. In some example embodiments, the gate isolation structure 130 may isolate a pair of gate structures or three or more pairs of gate structures. Hereinafter, the gate isolation structure 130 isolating the two pairs of gate structures will be described.

The gate isolation structure 130 may include a first isolation structure 131 of a line type extending in the X-direction and second isolation structures 132 of a hole type penetrating the first isolation structure 131. Upper surfaces of the first and second isolation structures 131 and 132 may be disposed on substantially the same level.

The first isolation structure 131 may have a line shape extending in the X-direction on the isolation layer 107 between the first and second active regions 105a and 105b (see, e.g., FIG. 2D). The first isolation structure 131 may extend into the device isolation layer 107 through the interlayer insulating layer 190. Accordingly, the lower surface of the first isolation structure 131 may have a lower level than the lower surface of the interlayer insulating layer 190.

Since the first isolation structure 131 is formed in the line type, process defects such as a defect caused by the gate structures 160 that oppose each other in the Y-direction not being sufficiently isolated may be prevented.

In some example embodiments, the first isolation structure 131 may include a material different from that of the second isolation structures 132. In some example embodiments, the first isolation structure 131 may include a material having an etch rate higher than that of the second isolation structures 132 under a specific etching condition. In some example embodiments, the first isolation structure 131 may include an insulating material. In some example embodiments, the first isolation structure 131 may include the same material as that of the interlayer insulating layer 190, for example, silicon oxide.

The second isolation structures 132 may have a plurality of holes penetrating the first isolation structure 131 between the first and second gate structures 160a and 160b and between the third and fourth gate structures 160c and 160d. For example, the second isolation structure may have a hole penetrating the first isolation structure 131 between the first gate structure 160a and the second gate structure 160b, and a hole penetrating the first isolation structure 131 between the third gate structure 160c and the fourth gate structure 160b. The second isolation structures 132 may penetrate the first isolation structure 131 and may be in contact with the device isolation layers 107 (see, e.g., FIG. 2B).

A width of each of the second isolation structures 132 in the X-direction may be narrower than a width of each of the gate structures 160 in the X-direction and greater than a width of the gate electrode 165 in the X-direction.

In some example embodiments, the second isolation structures 132 may include a first vertical pillar 132a physically isolating the gate electrodes 165 of the first and second gate structures 160a and 160b from each other, and a second vertical pillar 132b physically isolating the gate electrodes 165 of the third and fourth gate structures 160c and 160d from each other. On a plane, the first vertical pillar 132a may completely overlap the first and second gate structures 160a and 160b in the Y-direction, and the second vertical pillar 132b may completely overlap the third and fourth gate structures 160c and 160d in the Y-direction.

Since the second isolation structures 132 are formed in the shape of the plurality of holes, electrical isolation of the contact plugs 170 formed between the second isolation structures 132 may be prevented.

In some example embodiments, the second isolation structures 132 may include an insulating material different from that of the first isolation structure 131, that is, for example, at least one of silicon nitride, silicon oxynitride, or silicon carbonitride.

The contact plugs 170 may penetrate through the interlayer insulating layer 190 and may be connected to the source/drain regions 150, and may apply an electrical signal to the source/drain regions 150. In some example embodiments, the contact plugs 170 may include a common contact plug 171 connected to one of the first source/drain regions 150a on the first active region 105a and one of the second source/drain regions on the second active region 105b, and a single contact plug 172 connected to one of the first source/drain regions 150a on the common contact plug 171 on the first active region 105a or one of the second source/drain regions on the second active region 105b.

The common contact plug 171 may penetrate through the first isolation structure 131 together with the interlayer insulating layer 190 and may be connected to the first and second source/drain regions 150a and 150b. In an etching process for forming a contact hole corresponding to the common contact plug 171, because the first isolation structure 131 becomes an etching target, an electrical isolation phenomenon of the common contact plug 171 may be prevented. This electrical isolation phenomenon may be because the first isolation structure 131, which has an etch rate higher than that of the second isolation structures 132, may become an etch target for forming the contact hole.

In some example embodiments, the common contact plug 171 may include a first portion 171_1 between the first and third gate structures 160a and 160c, a second portion 171_2 between the second isolation structures 132, and a third portion 171_3 between the second and fourth gate structures 160b and 160d (see, e.g., FIG. 1). A width of the second portion 171_2 in the X-direction may be greater than the width of the first portion 171_1 in the X-direction and/or the width of the third portion 171_3 in the X-direction. On a plane, the second portion 171_2 may have an upwardly curved shape, as illustrated in FIG. 1. This shape may be because the common contact plug 171 may be a self-aligned contact (SAC) in which a contact hole may be formed by the nitride-based capping layer 166 and the second isolation structures 132. Since the common contact plug 171 has a self-aligned contact structure, the common contact plug 171 may extend in the Z-direction perpendicular to the substrate 101 along at least one side of the capping layer 166 and the second isolation structures 132. The second portion 171_2 may penetrate through the first isolation structure 131, and at least a portion of a side surface of the second portion 171_2 may be in contact with the second isolation structures 132. In some example embodiments, a lower surface of the second portion 171_2 may be disposed on a level higher than a level of a lower surface of the gate isolation structure 130 (see, e.g., FIG. 2B). Lower surfaces of the first and third portions 171_1 and 171_3 may be in contact with different source/drain regions 150, and a lower surface of the second portion 171_2 may be disposed on a level lower than a level of the lower surfaces of the first and third portions 171_1 and 171_3 in contact with the source/drain regions 150.

The common contact plug 171 may include a first plug layer 171a and a first barrier layer 171b. The first plug layer 171a may include, for example, a metal nitride such as a titanium nitride film (TiN), a tantalum nitride film (TaN), or a tungsten nitride film (WN), and/or a metal material such as aluminum (Al), tungsten (W), or molybdenum (Mo). The first barrier layer 171*b* may conformally cover side surfaces and a bottom surface of the first plug layer 171*a*. The first barrier layer 171*b* may include, for example, a metal nitride such as a titanium nitride layer (TiN), a tantalum nitride layer (TaN), or a tungsten nitride layer (WN).

The single contact plug 172 may be connected to one source/drain region 150 through the interlayer insulating layer 190, and may be a self-aligned contact similarly to the common contact plug 171. In some example embodiments, the single contact plug 172 may include a second plug layer 172*a* and a second barrier layer 172*b*, and the second plug layer 172*a* may have a material the same as or similar to that of the first plug layer 171*a*, and the second barrier layer 172*b* may have a material the same as or similar to that of the first plug layer 171*b*.

The interlayer insulating layer 190 may be disposed to cover the source/drain regions 150 and the gate structures 160, and to cover the device isolation layers 107 in a region not illustrated. The interlayer insulating layer 190 may include, for example, at least one of an oxide, a nitride, or an oxynitride, and may include a low-K material.

In some example embodiments, the semiconductor device 100 may further include an insulating liner 191 covering a lower surface of the interlayer insulating layer 190. The insulating liner 191 may include a material different from that of the interlayer insulating layer, that is, for example, a silicon nitride or a silicon nitride-based insulating material. The insulating liner 191 may be disposed between the device isolation layers 107 and the interlayer insulating layer 190 and may extend to surfaces of the source/drain regions 150 not being in contact with the contact plugs 170. Also, the insulating liner 191 may extend to side surfaces of the gate structures 160.

In some example embodiments, a lower surface of the capping layer 166 may cover the gate electrode 165, the spacer structure 164, and an insulating liner 191 extending to side surfaces of the spacer structure 164.

In some example embodiments, the semiconductor device 100 may include a first transistor TR1 including the first active region 105*a*, the first channel structure, the first source/drain region 150*a*, and gate structures 160, and a second transistor TR2 including the second active region 105*b*, the second channel structure, the second source/drain region 150*b*, and gate structures 160. One of the first and second transistors TR1 and TR2 may be an NMOS transistor region, and the other may be a PMOS transistor region.

In the first and second transistors TR1 and TR2, active regions 105 may have a fin structure, and a gate electrode 165 may be disposed between the active regions 105 and the channel layers 140, between the channel layers 140, and on the channel layers 140. Accordingly, the first and second transistors TR1 and TR2 may be a transistor having a multi-bridge-channel FET (MBCFET™) structure, a gate-all-around (GAA) type field effect transistor by the channel layers 140, the source/drain regions 150, and the gate structures 160.

However, in some example embodiments, differently from the above description, in the first and second transistors TR1 and TR2, the active regions 105 may have a fin structure, and the gate electrode 165 may cover the active regions 105 and an upper surface and a side surface of a channel layer disposed on the active regions 105. Accordingly, the first and second transistors TR1 and TR2 may be fin-type field effect transistors formed by the channel layer, the source/drain regions 150, and the gate structures 160.

Figure 3A:
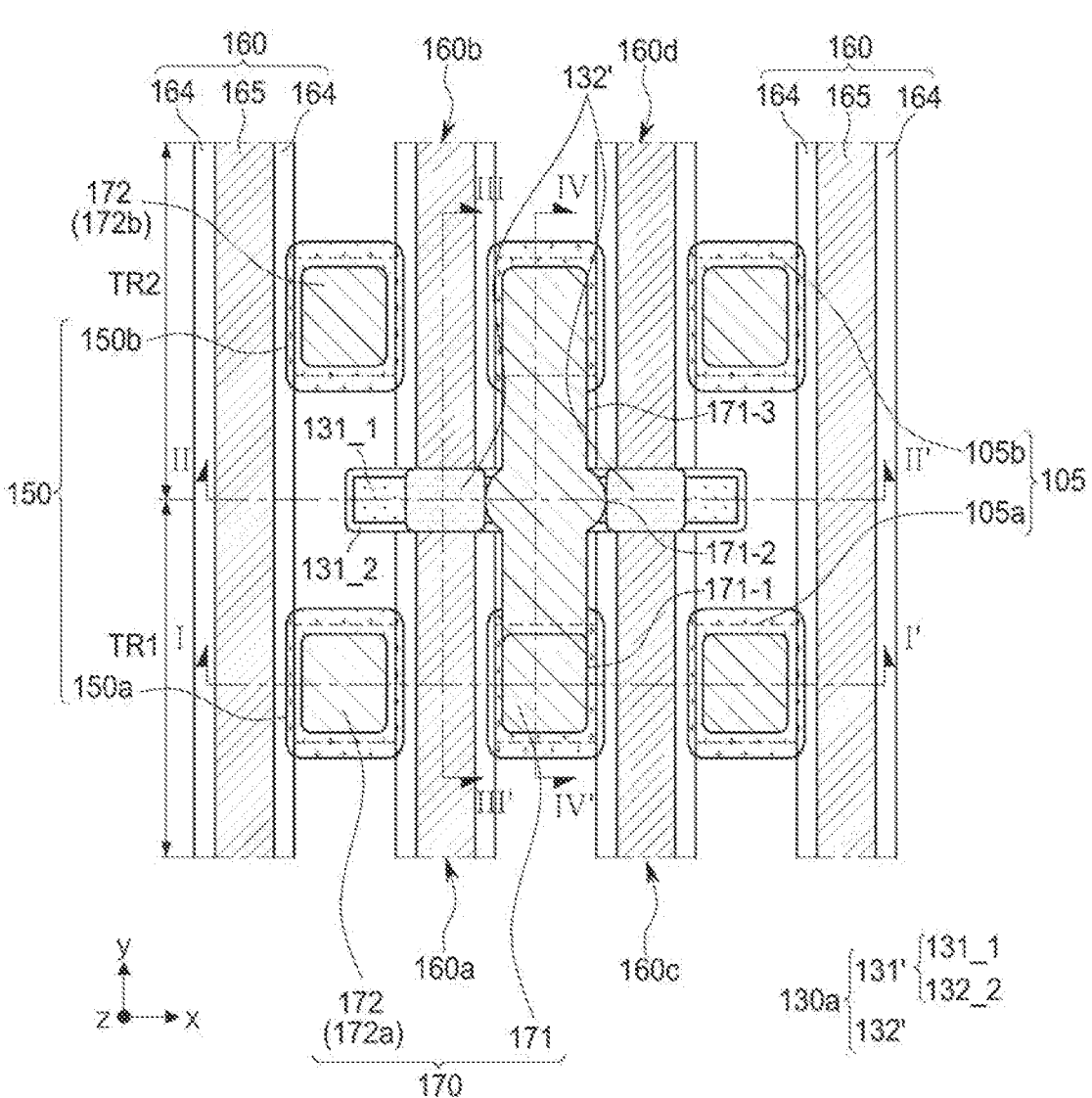
FIGS. 3A to 3C are plan diagrams illustrating a semiconductor device according to some example embodiments.
Figure 3B:
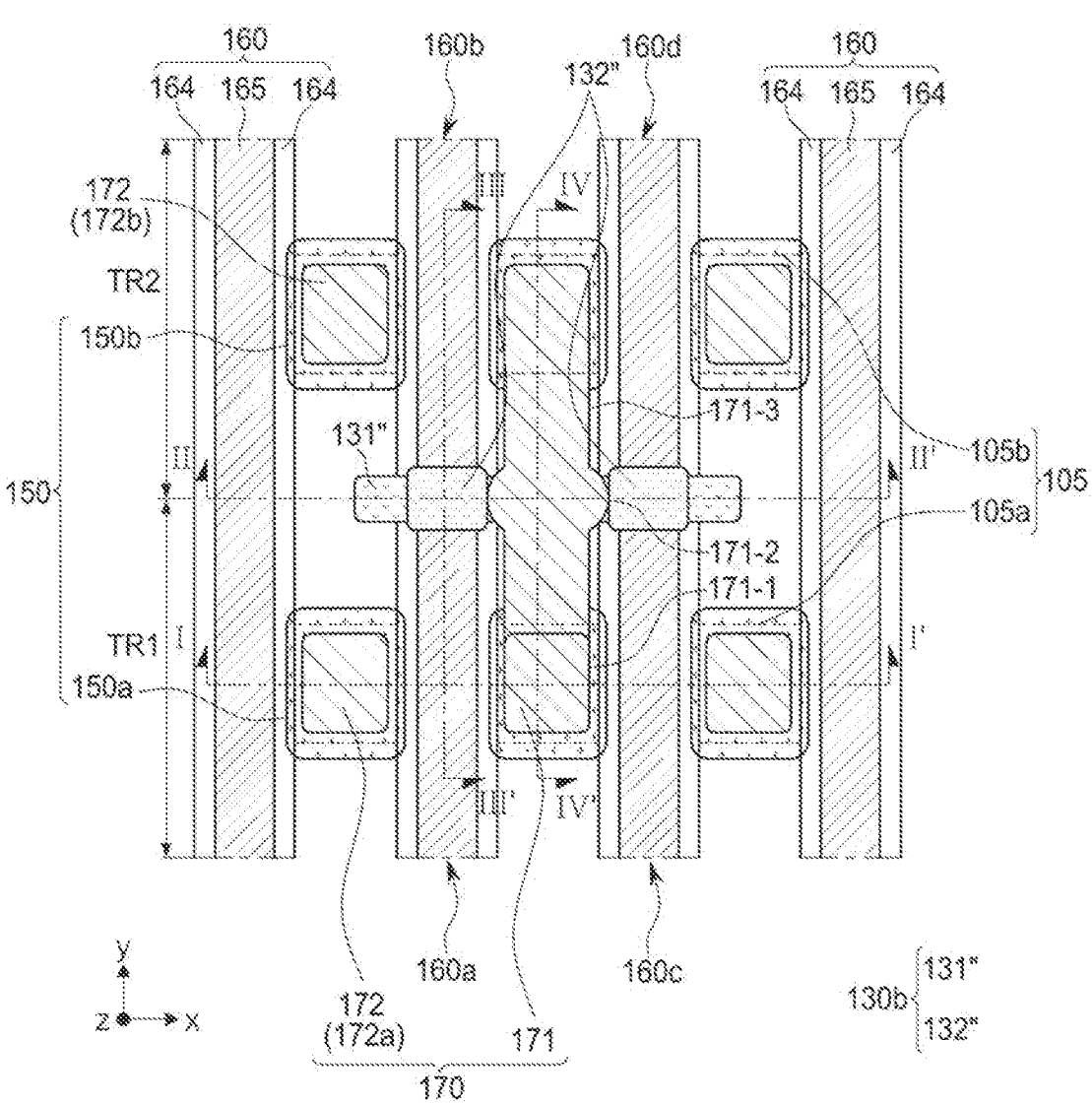
Figure 3C:
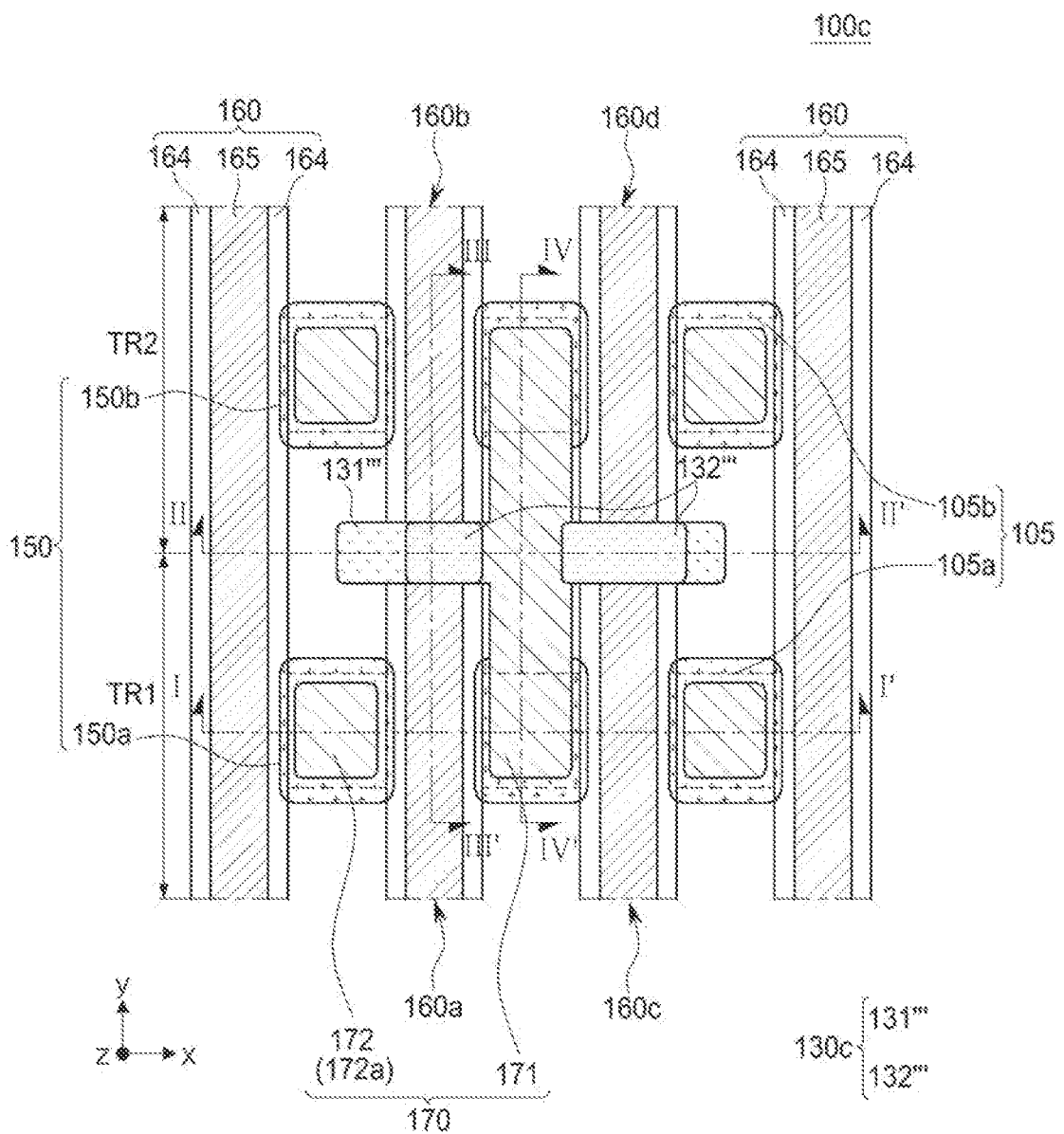

FIGS. 3A to 3C are plan diagrams illustrating a semiconductor device according to some example embodiments.

Referring to FIG. 3A, the semiconductor device 100*a* may have a structure of the gate isolation structure 130*a* different from the example in FIG. 1.

The gate isolation structure 130*a* may include first and second isolation structures 131' and 132', and the first isolation structure 131' may include a first isolation structure 131' including a gap-fill insulating layer 131_1 and a barrier layer 131_2. The gap-fill insulating layer 131_1 may have a line shape extending in the X-direction, may penetrate the interlayer insulating layer 190 and may be in contact with the device isolation layers 107. The gap-fill insulating layer 131_1 may include, for example, silicon oxide. The barrier layer 131_2 may cover side surfaces and a bottom surface of the gap-fill insulating layer 131_1. The barrier layer 131_2 may have a substantially uniform thickness. The barrier layer 131_2 may include, for example, SiOC, SiN, or polysilicon.

The second isolation structures 132' may penetrate the gap-fill insulating layer 131_1 and the barrier layer 131_2 of the first isolation structure 131' and may be in contact with the device isolation layers 107.

Referring to FIG. 3B, the semiconductor device 100*b* may have a structure of the gate isolation structure 130*b* different from the example in FIG. 1.

The gate isolation structure 130*b* may include first and second isolation structures 131" and 132".

A width of each of the second isolation structures 132" in the Y-direction may be greater than a width of the first isolation structures 131" in the Y-direction. This configuration may be because the second isolation structures 132" may be formed by an etching process performed after the first isolation structures 131" is formed.

Referring to FIG. 3C, the semiconductor device 100*c* may have a structure of the gate isolation structure 130*c* different from the example in FIG. 1.

The gate isolation structure 130*c* may include first and second isolation structures 131''' and 132'''.

Each of the second isolation structures 132"" may have the same width in the X-direction as compared to the second isolation structures 132 in FIG. 1, and may be misaligned or may have a relatively large width in the X-direction.

Returning to FIGS. 1-2D, the common contact plug 171 may have the first to third portions 171_1, 171_2, and 171_3, and a width of the second portion 171_2 in the X-direction may be narrower than a width of the first portion 171_1 in the X-direction or the width of the third portion 171_3 in the X-direction. In some example embodiments, the first width t1 of the first portion 171_1 may be smaller than the second width t2 of the second portion 171_2 (see, e.g., FIGS. 2A and 2B). The first width t1 and the second width t2 may be defined as a maximum width or an average width of each component.

Returning to FIG. 3C, the second isolation structures 132"" may be in contact with the second portion 171_2. On a plane, the second portion 171_2 may have an inwardly curved shape, as illustrated in FIG. 3C. This configuration may be because the common contact plug 171 may be a self-aligned contact which may be misaligned or self-aligned by the second isolation structures 132" having a relatively large width.

Figure 4:
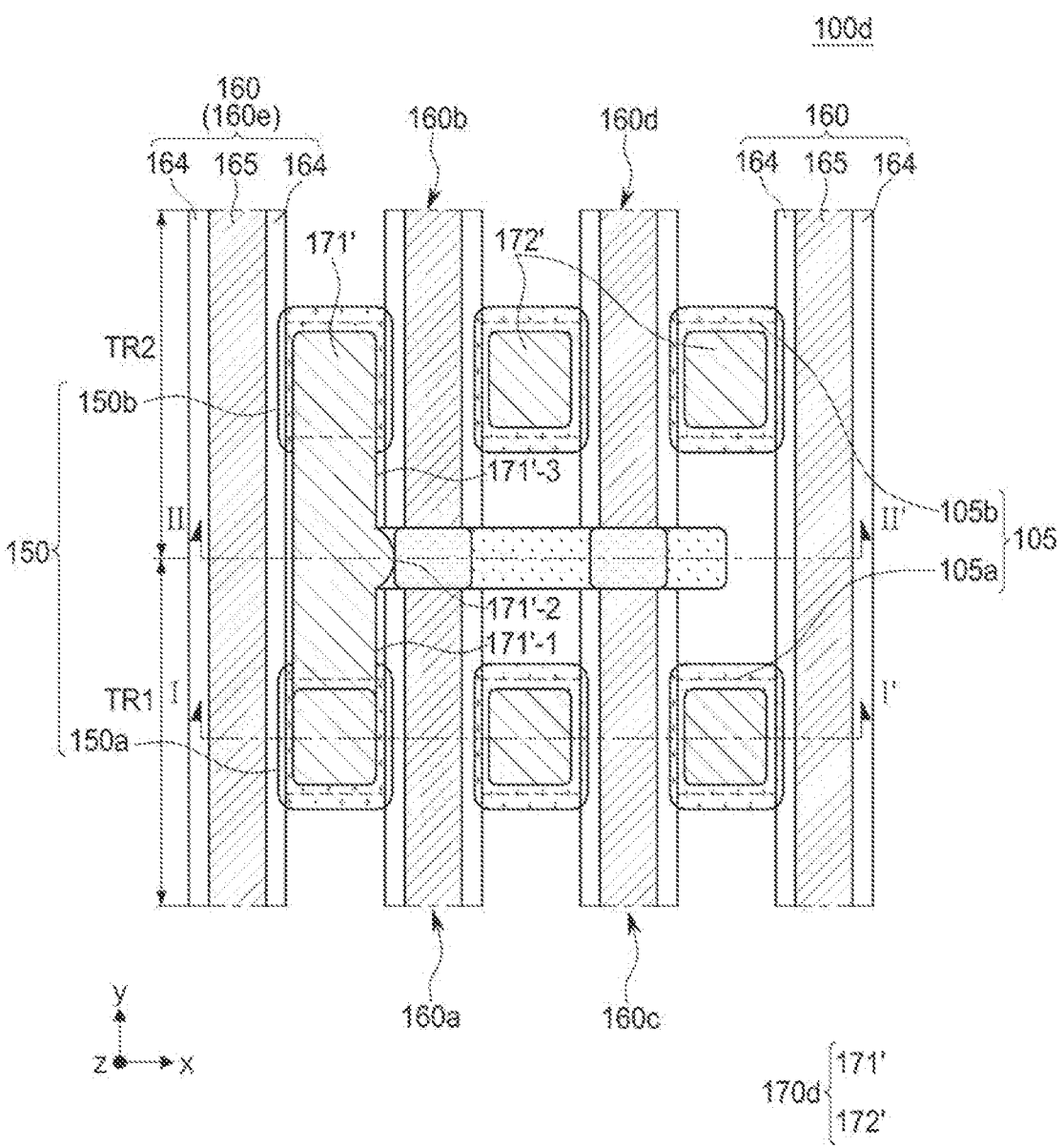
FIG. 4 is a plan diagram illustrating a semiconductor device according to some example embodiments.

FIG. 4 is a plan diagram illustrating a semiconductor device according to some example embodiments.

Referring to FIG. 4, the semiconductor device 100d may have a structure of contact plugs 170d different from the example in FIG. 1.

The contact plugs 170d may include a common contact plug 171' and a single contact plug 172".

Differently from FIG. 1, the common contact plug 171' may be disposed between fifth gate structures 160e spaced apart from the gate isolation structure 130 and the first and second gate structures 160a and 160b isolated by the gate isolation structure 130.

The common contact plug 171' may include a first portion 171'_1 adjacent to the first gate structure 160a, a second portion 171'_2 adjacent to the gate isolation structure 130, and a third portion 171'_3 adjacent to the second gate structure 160b. The width of the second portion 171'_2 in the X-direction may be greater than the width of the first portion 171'_1 in the X-direction and/or the width of the third portion 171'_3 in the X-direction. In some example embodiments, on a plane, the second portion 171'_2 may have an upwardly curved shape, curved toward the second isolation structures 132. However, in some example embodiments, the second portion 171'_2 may not have an upwardly curved shape, curved toward the fifth gate structure 160e. Side surfaces of the first to third portions 171'_1, 171'_2, and 171'_3 may extend in a linear line along the side surface of the fifth gate structure 160e.

Figure 5:
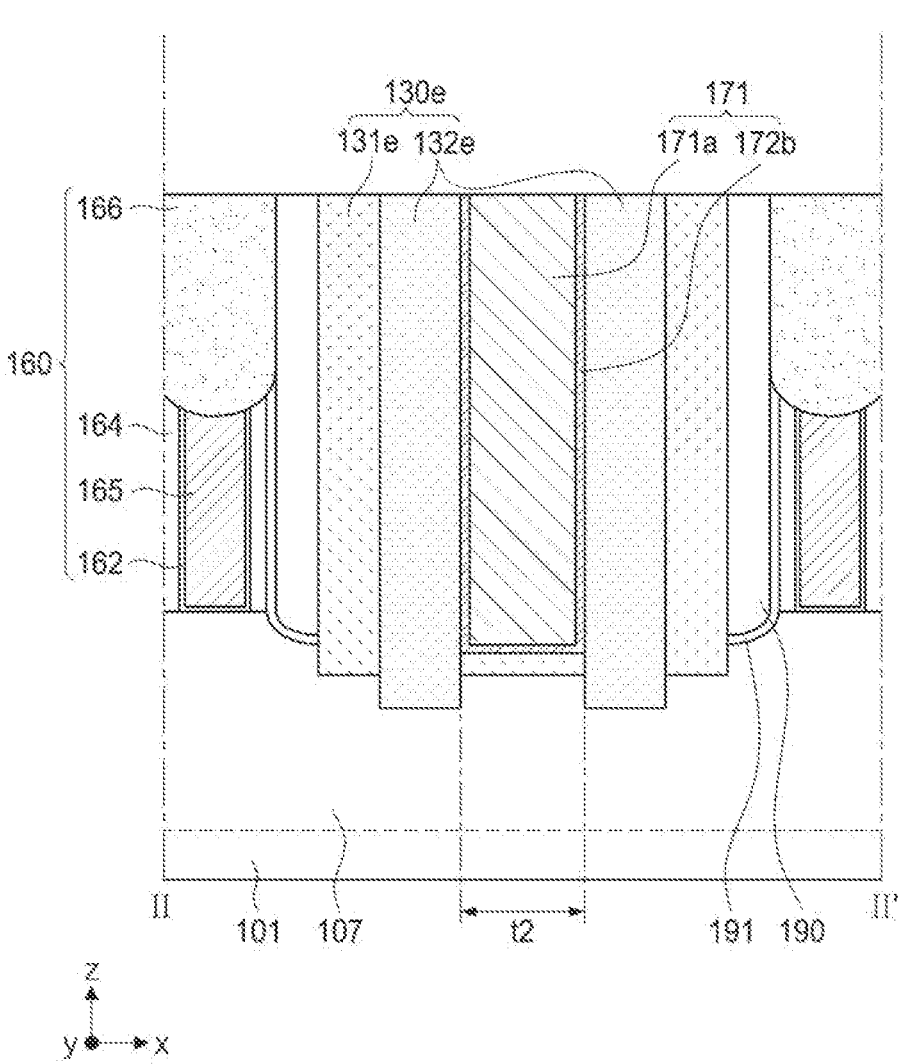
FIG. 5 is a cross-sectional diagram illustrating a semiconductor device according to some example embodiments.

FIG. 5 is a cross-sectional diagram illustrating a semiconductor device according to some example embodiments.

Referring to FIG. 5, the semiconductor device 100e may have a gate isolation structure 130e different from the gate isolation structure of the semiconductor device 100 in FIGS. 1 to 2D.

The lower surface of the gate isolation structure 130e may be disposed on a level lower than a level of the lower surface of the interlayer insulating layer 190.

The gate isolation structure 130e may include first and second isolation structures 131e and 132e, and lower surfaces of the second isolation structures 132e may be disposed on a level lower than a level of the lower surfaces of the first isolation structures 131e. This configuration may be because an opening having a relatively deep depth is formed in an etching process for forming the hole-type second isolation structures 132e. Accordingly, side surfaces and bottom surfaces of lower ends of the second isolation structures 132e may be surrounded by the device isolation layers 107.

Figure 6:
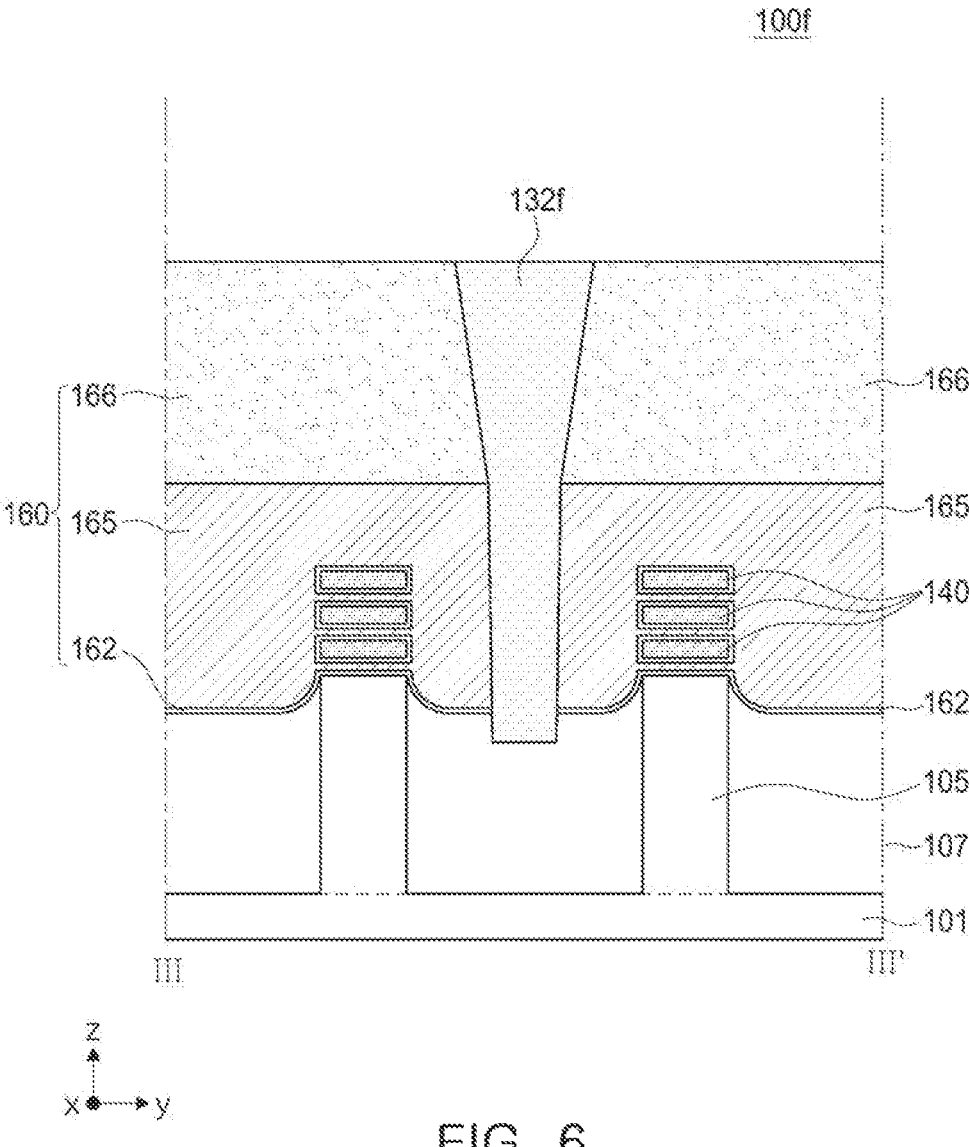
FIG. 6 is a cross-sectional diagram illustrating a semiconductor device according to some example embodiments.
Figure 7:
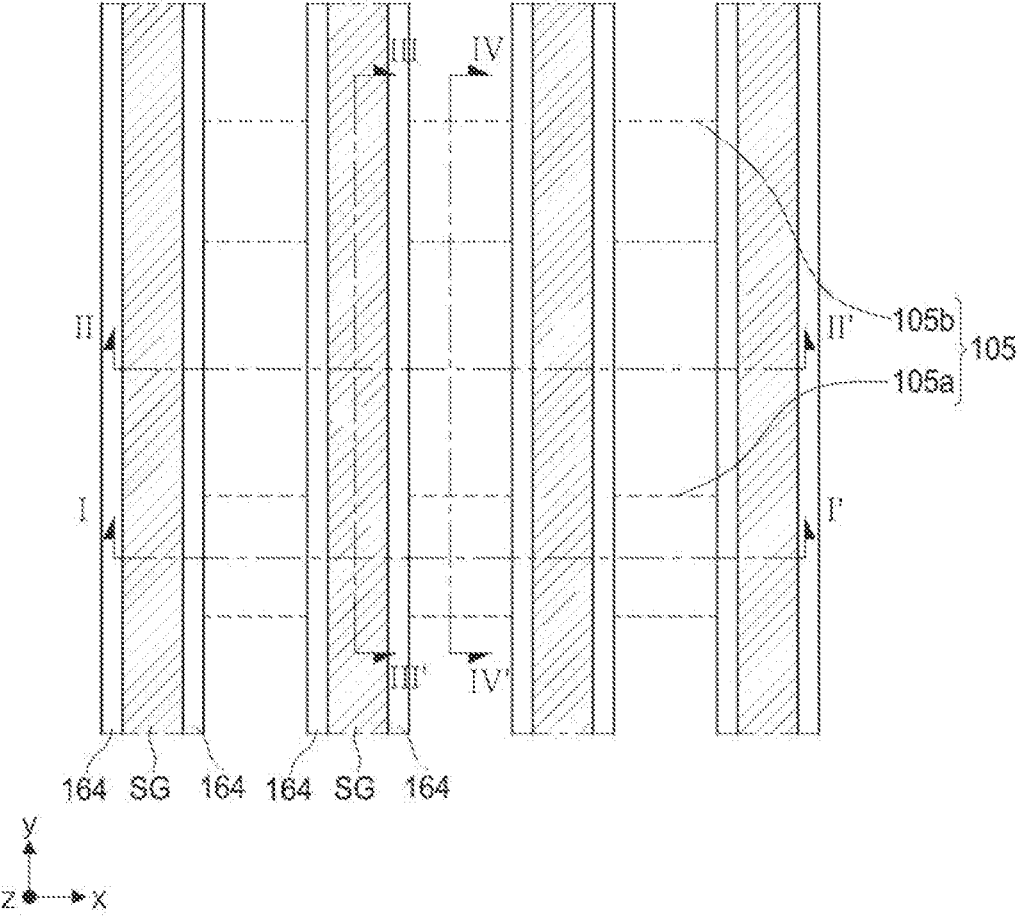
FIGS. 7 to 18B are diagrams illustrating processes of a method of manufacturing a semiconductor device in order according to some example embodiments.
Figure 8A:
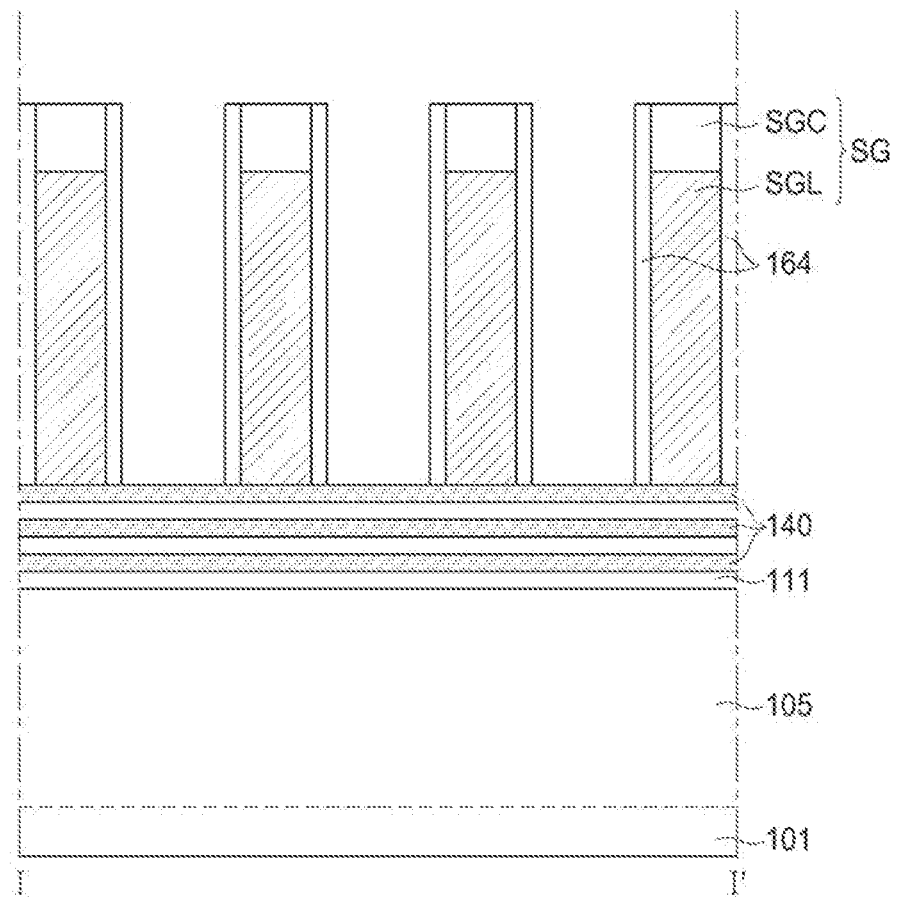
Figure 8B:
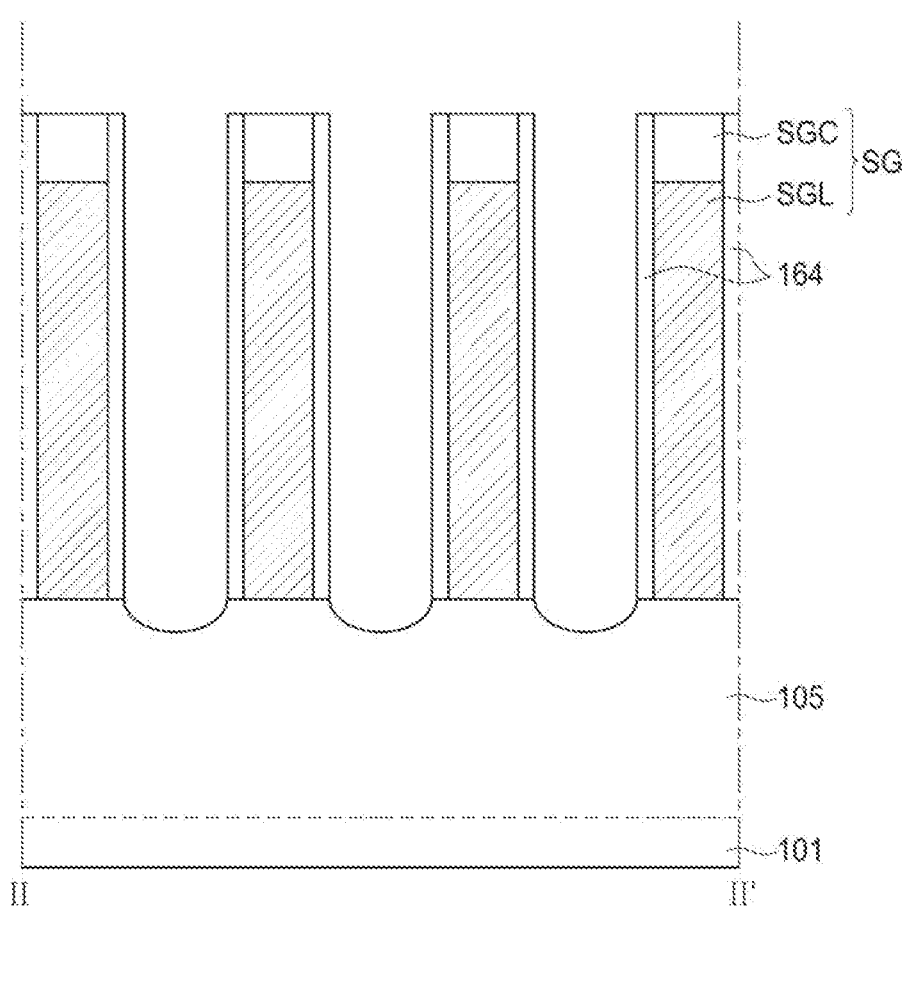
Figure 8C:
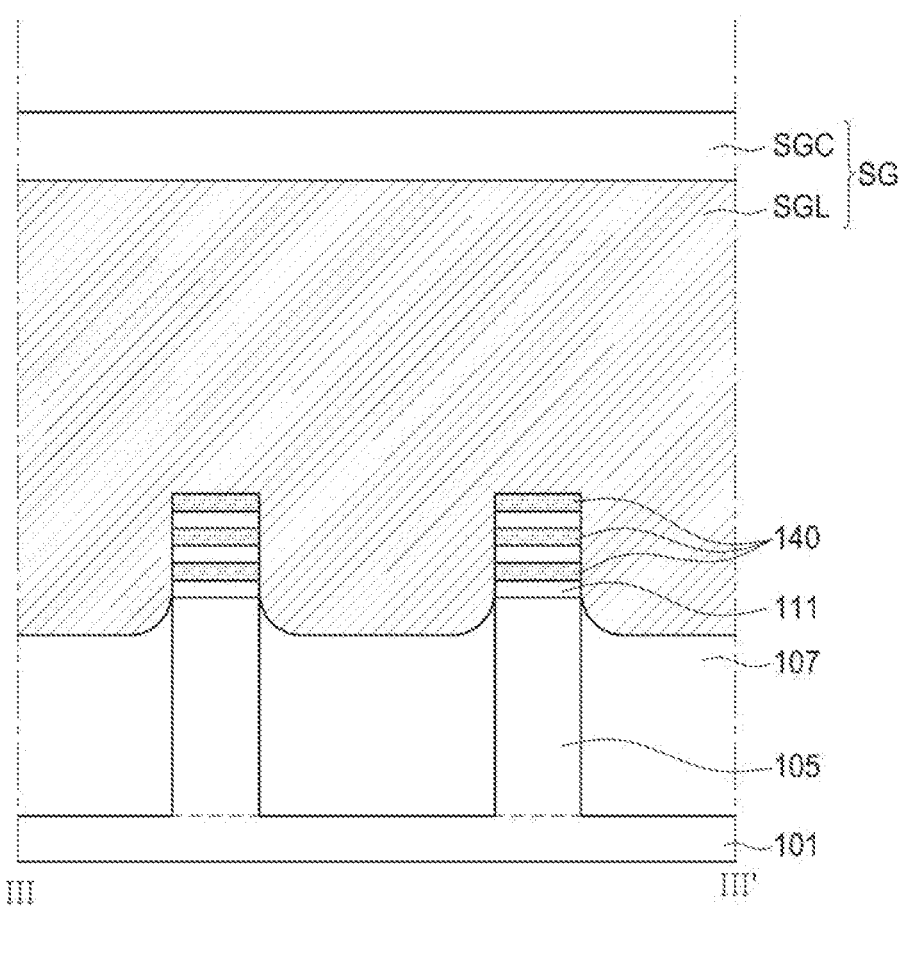
Figure 8D:
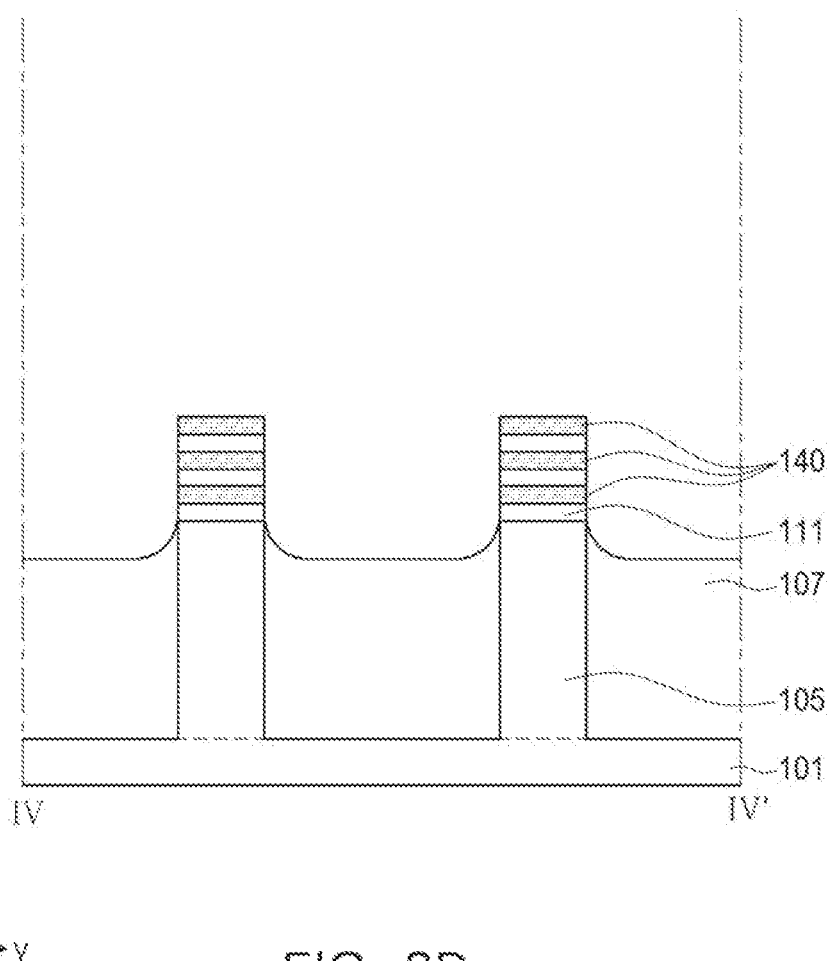

FIG. 6 is a cross-sectional diagram illustrating a semiconductor device according to some example embodiments.

Referring to FIG. 6, the semiconductor device 100f may have a structure of second isolation structures 132f different from the structure in the semiconductor device 100 in FIGS. 1 to 2D.

The second isolation structures 132f may have inclined side surfaces of which a width may decrease in the direction toward the substrate 101 depending on an aspect ratio. In this case, the width of the second isolation structures 132f may decrease toward the substrate 101 from an upper portion of the gate structures adjacent to each other in the Y-direction (e.g., the first and second gate structures 160a and 160b). In some example embodiments, the slope of the side surface of the portion penetrating through the capping layer 166 may be different from the slope of the side surface of the portion penetrating through the gate electrode 165.

FIGS. 7 to 18B are diagrams illustrating processes of a method of manufacturing a semiconductor device in order according to some example embodiments.

FIGS. 7, 11, 13, 15, and 17 are plan diagrams illustrating a method of manufacturing a semiconductor device according to some example embodiments. FIGS. 8A, 9A, 10A and 12A are cross-sectional diagrams illustrating a region taken along line I-I' in FIGS. 7 and 11. FIGS. 8B, 10B, 12B, 14A, 16A, and 18A are cross-sectional diagrams illustrating a region taken along line II-II' in FIGS. 7, 11, 13, 15, and 17. FIGS. 8C, 10C, 12C, 14B, 16B, and 18B are cross-sectional diagrams illustrating a region taken along line III-III' in FIGS. 7 and 11, 13, 15, and 17. FIGS. 8D, 9B, 10D, 14C, and 16C are cross-sectional diagrams illustrating a region taken along line IV-IV' in FIGS. 7, 13, and 15.

Referring to FIGS. 7, 8A, 8B, 8C, and 8D, the active structures 105, 111, and 140 may be formed on the substrate 101, sacrificial gate structures SG intersecting the active structures 105, 111, and 140 may be formed, and a spacer structure 164 may be formed on both sidewalls of the sacrificial gate structures SG.

The active structures 105, 111, and 140 may be formed by forming the sacrificial layers 111 and the channel layers 140 alternately stacked on the substrate 101, and forming a trench defining the active regions 105 by etching at least a portion of the sacrificial layers 111, the channel layers 140, and the substrate 101. The active structures 105, 111, and 140 may include active regions 105, and sacrificial layers 111 and channel layers 140 alternately stacked on the active regions 105.

The sacrificial layers 111 and the channel layers 140 may be formed by an epitaxial growth process. The sacrificial layers 111 may be replaced by the gate dielectric layer 162 and the gate electrode 165 as illustrated in FIG. 2A through a subsequent process. The sacrificial layers 111 may be formed of a material having etch selectivity with respect to the channel layers 140. The sacrificial layers 111 and the channel layers 140 may include, for example, a semiconductor material including at least one of silicon (Si), silicon germanium (SiGe), or germanium (Ge), and may include different materials. The sacrificial layers 111 may include, for example, silicon germanium (SiGe), and the channel layers 140 may include silicon (Si). In some example embodiments, three channel layers 140 may be stacked with substantially the same thickness, but example embodiments are not limited thereto and, in some example embodiments, the number of the channel layers and thicknesses of the channel layers may be varied in example embodiments.

The active regions 105 may be regions defined by the trench. The active regions 105 may be regions formed to protrude from the upper surface of the substrate 101 by removing a portion of the substrate 101. The active regions 105 may have a shape protruding from the substrate 101 in the Z-direction perpendicular to the substrate 101, and may be formed of the same material as that of the substrate 101. The active regions 105 may be formed in a line shape extending in one direction, that is, for example, the X-direction, and may be spaced apart from each other in the Y-direction.

In some example embodiments, the active structures 105, 111, and 140 may include a first active structure and a second active structure spaced apart from each other in the Y-direction. The first active structure may include a first active region 105a, first sacrificial layers and first channel layers alternately stacked on the first active region 105a, and the second active structure may include a second active region 105b and a second active region and second sacrificial layers and second channel layers alternately stacked on the second active region 105b. The first active region 105a and the second active region 105b may have different conductivity types. The first channel layers and the second channel layers may have different conductivity types. The first active region 105*a* and the first channel layers may have the same conductivity type, and the second active region 105*b* and the second channel layers may also have the same conductivity type. In some example embodiments, the first active region 105*a* may be an N-type conductivity and the second active region 105*b* may be a P-type conductivity.

The device isolation layers 107 may be formed by filling the region from which the substrate 101 is partially removed with an insulating material, and removing a portion of the insulating material to protrude the active regions 105. The device isolation layers 107 may be formed to cover a portion of side surfaces of the active regions 105. An upper surface of the device isolation layers 107 may be formed on a level lower than a level of an upper surface of the active regions 105. The device isolation layers 107 may include silicon oxide.

Thereafter, sacrificial gate structures SG intersecting the active structures 105, 111, and 140 and parallel to each other may be formed. Each of the sacrificial gate structures SG may have a line shape extending in one direction, that is, for example, a Y-direction. The sacrificial gate structures SG may be sacrificial structures formed in a region in which the gate dielectric layer 162 and the gate electrode 165 are disposed on the channel layers 140 as illustrated in FIG. 2A through a subsequent process. The sacrificial gate structures SG may include a sacrificial gate layer SGL and a sacrificial gate capping layer SGC. The sacrificial gate layer SGL may be formed of, for example, polysilicon, and the sacrificial gate capping layer SGC may be formed of a silicon nitride layer.

In some example embodiments, each of the sacrificial gate structures SG may further include a sacrificial gate insulating layer disposed below the sacrificial gate layer SGL. The sacrificial gate insulating layer may be formed of a material having an etch selectivity with respect to the sacrificial gate layer SGL, and may be, for example, one of thermal oxide, silicon oxide, or silicon nitride.

Thereafter, spacer structures 164 may be formed on both sidewalls of the sacrificial gate structures SG. The spacer structure 164 may be in contact with a side surface of the sacrificial gate insulating layer SGI. The spacer structure 164 may be formed by forming a film having a uniform thickness along the upper and side surfaces of the sacrificial gate structures SG and the active structures 105, 111, and 140, and performing anisotropic etching. The spacer structure 164 may include an insulating material, such as, for example, at least one of SiO, SiN, SiCN, SiOC, SiON, and SiOCN.

Figure 9A:
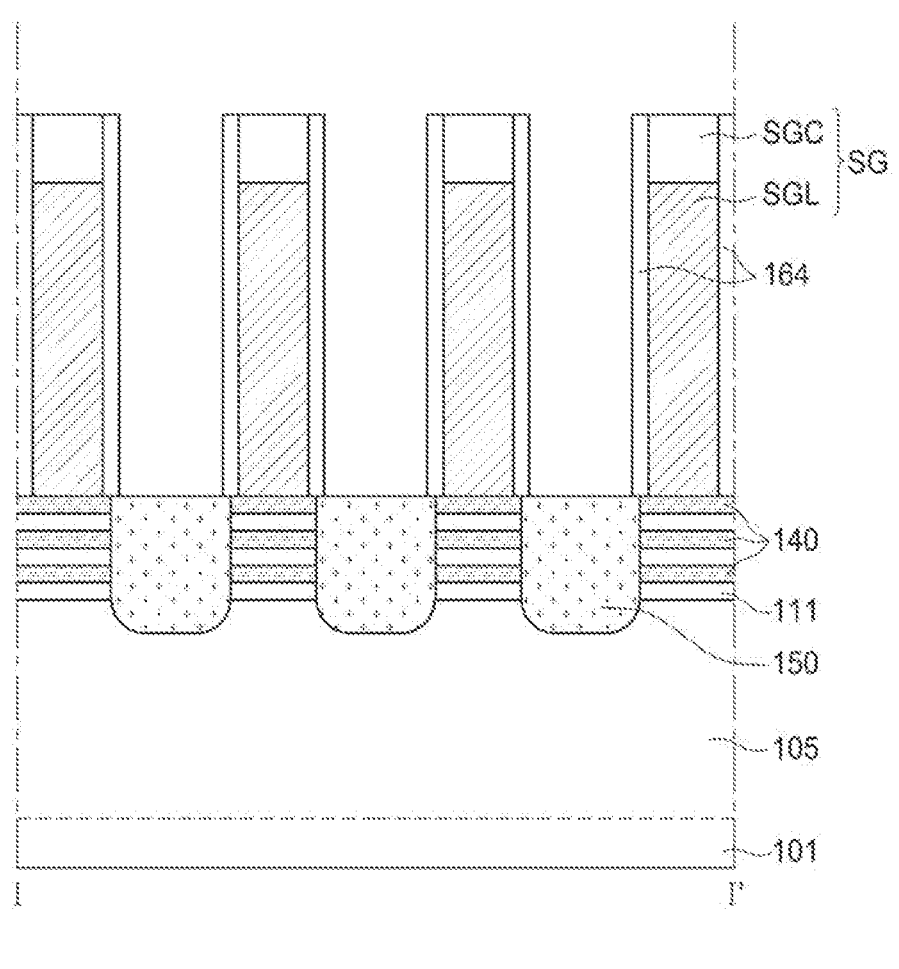
Figure 9B:
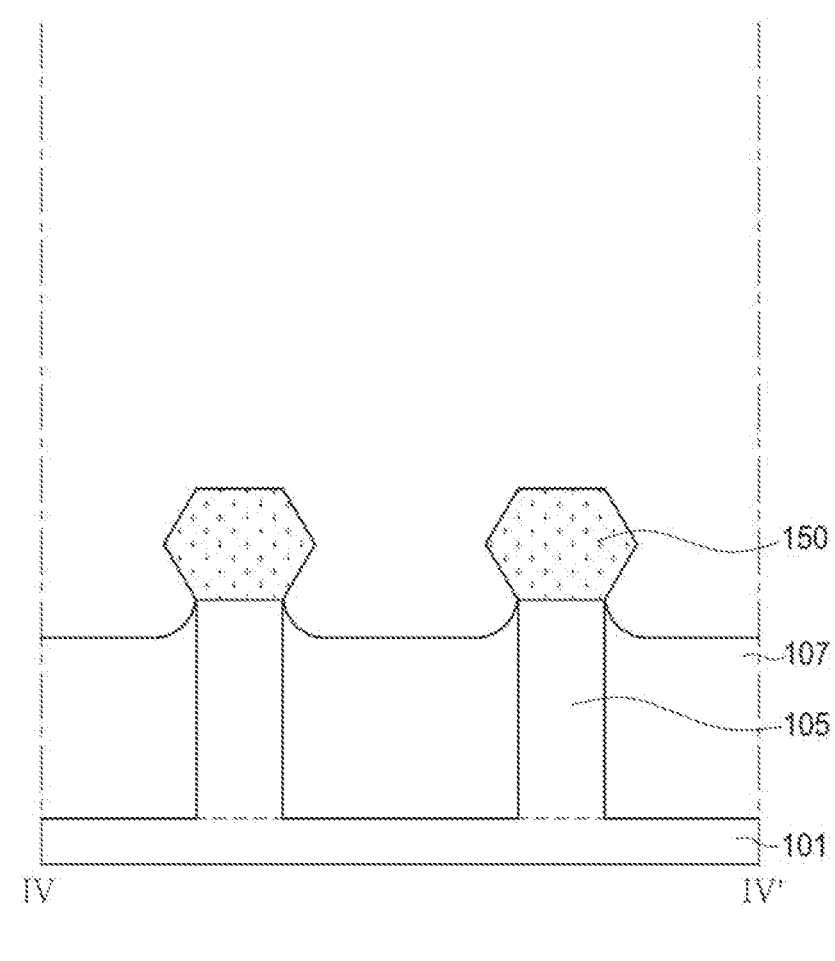
Figure 10A:
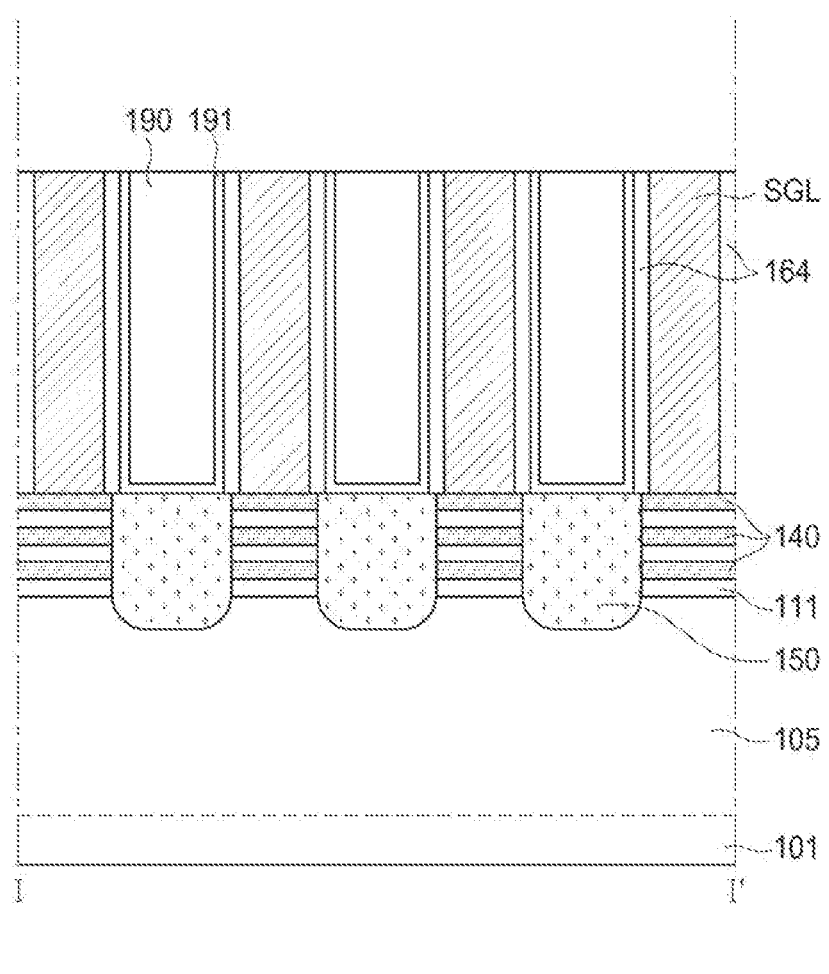
Figure 10B:
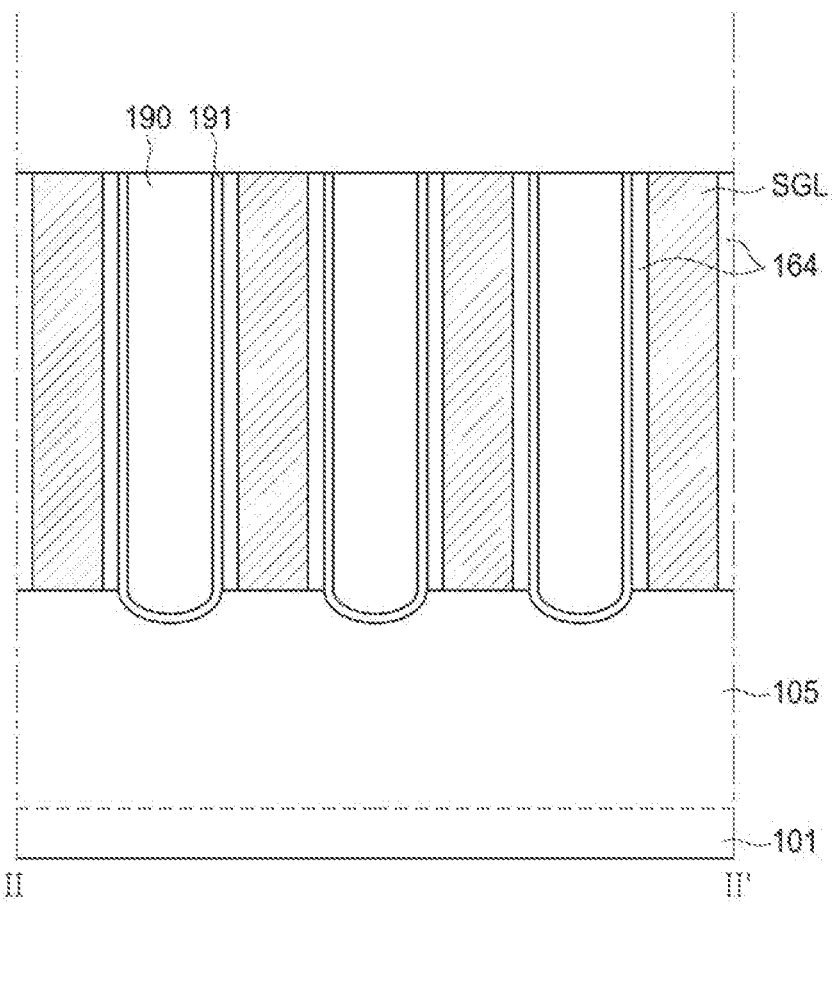
Figure 10C:
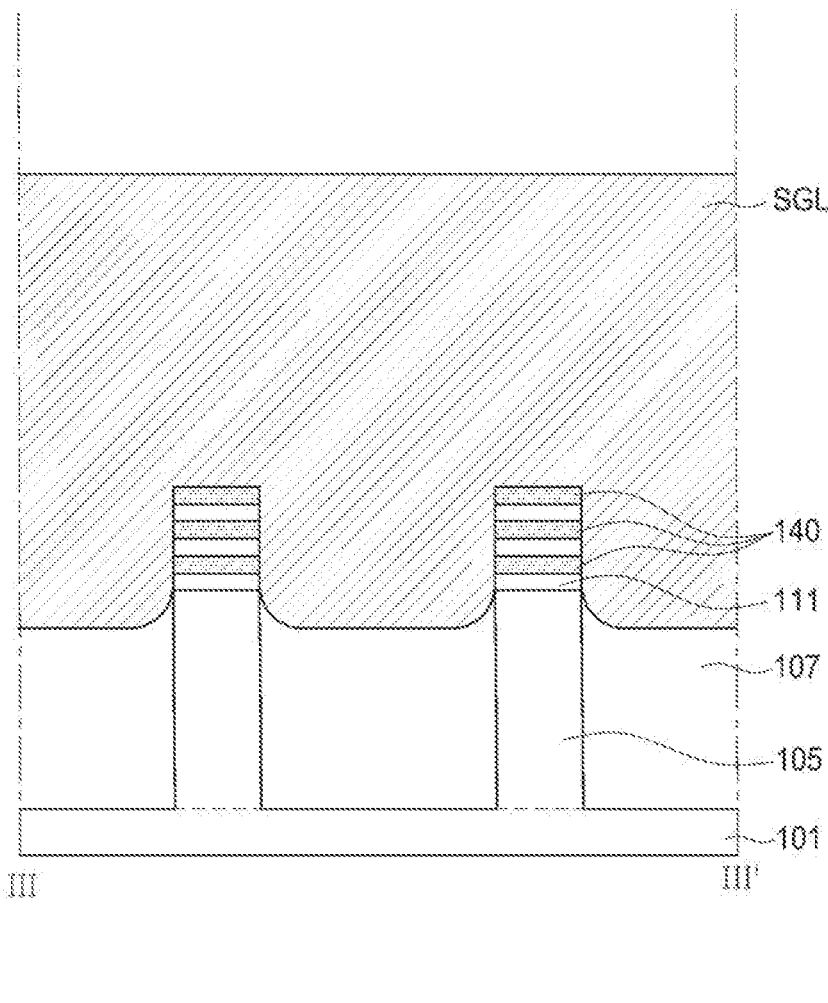
Figure 10D:
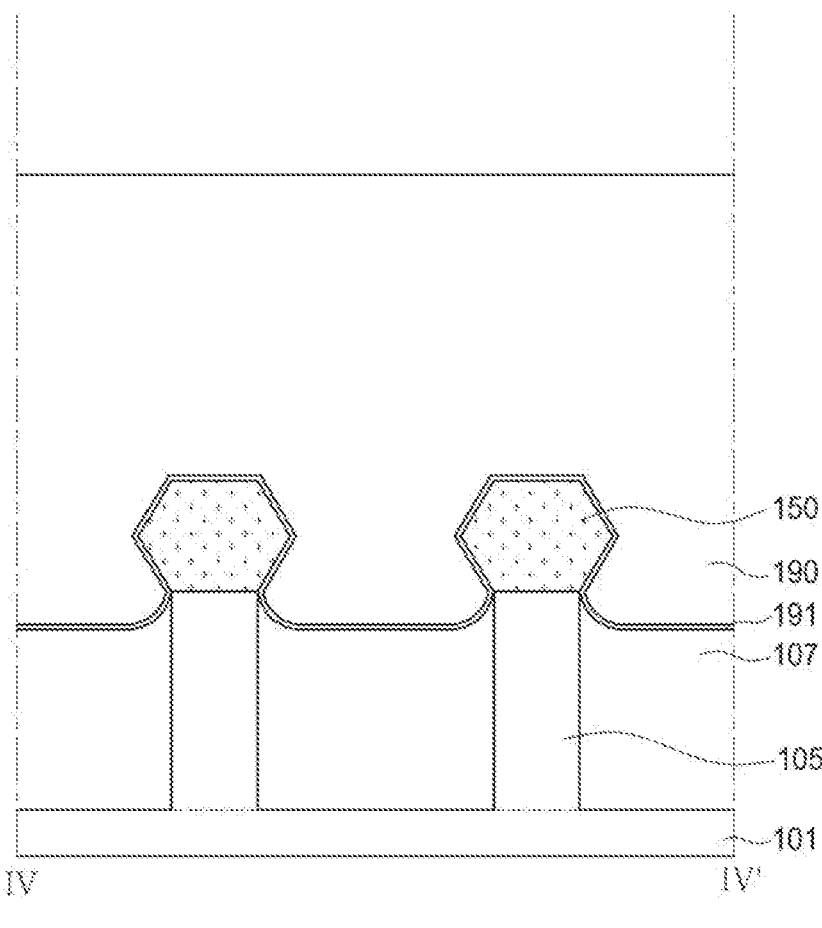
Figure 11:
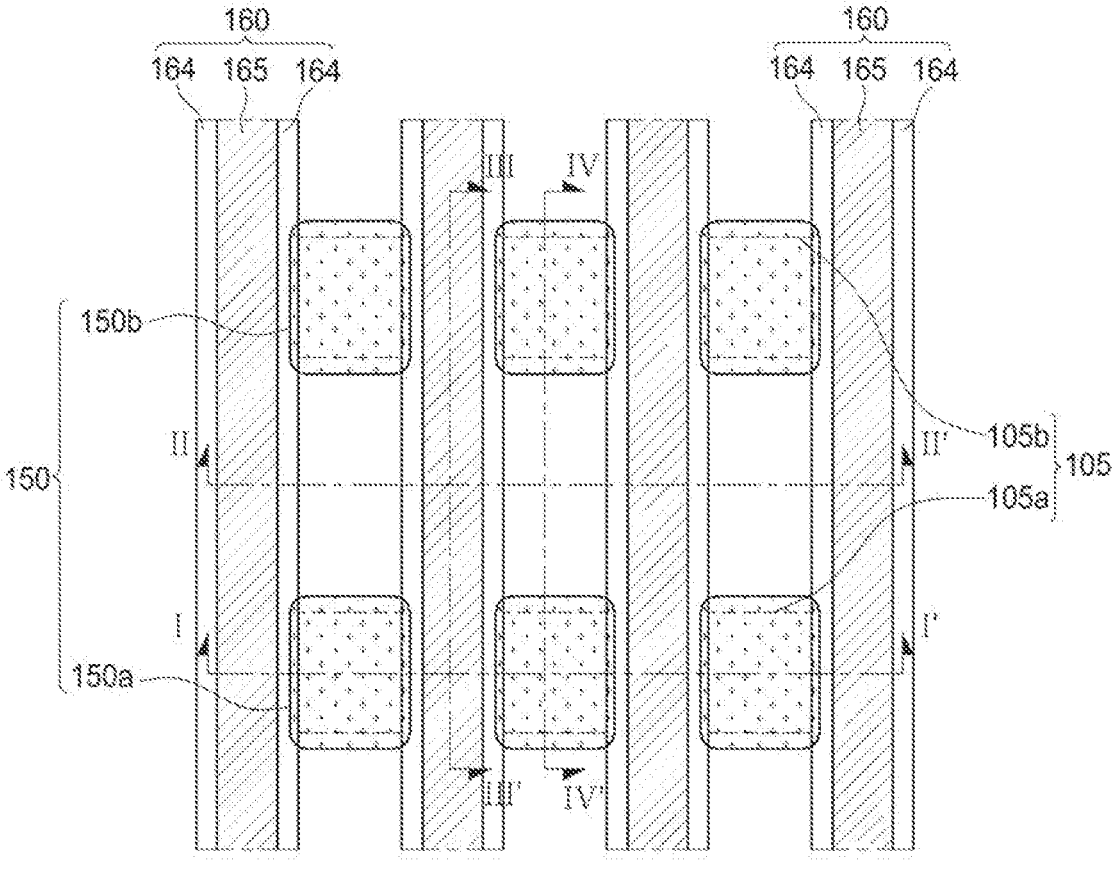
Figure 12A:
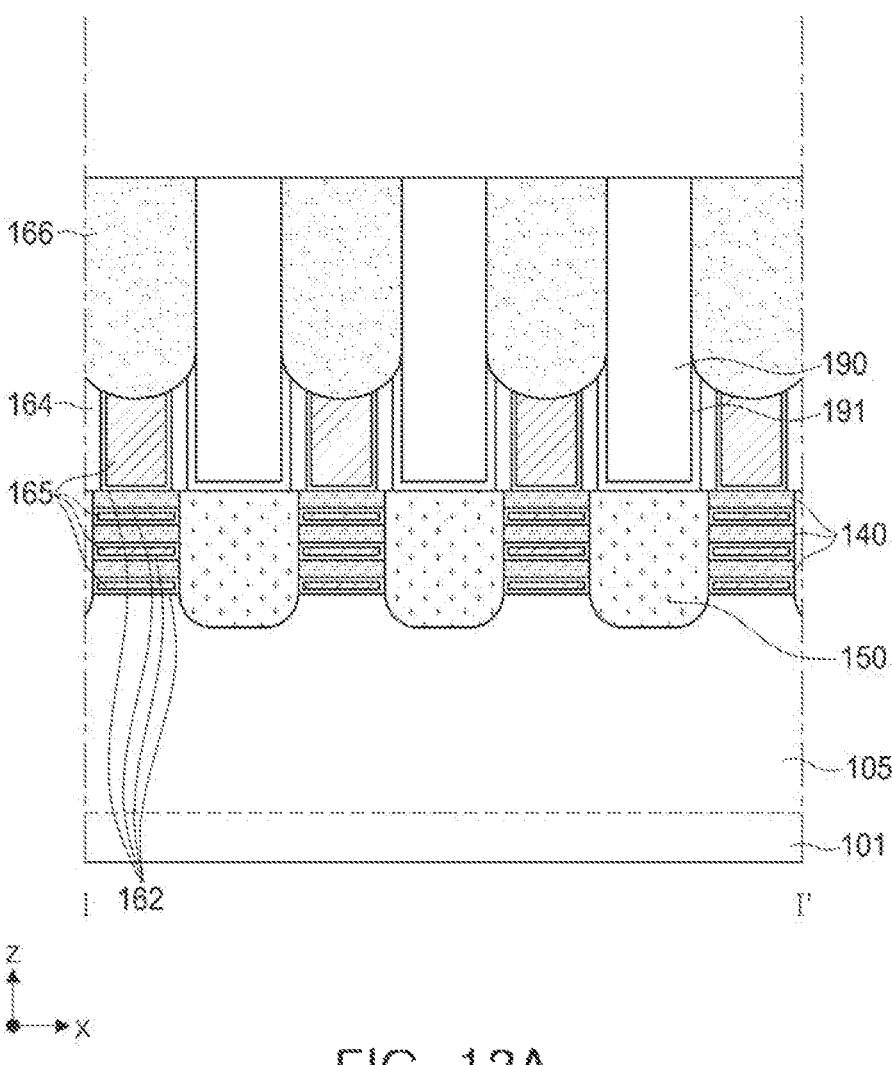
Figure 12B:
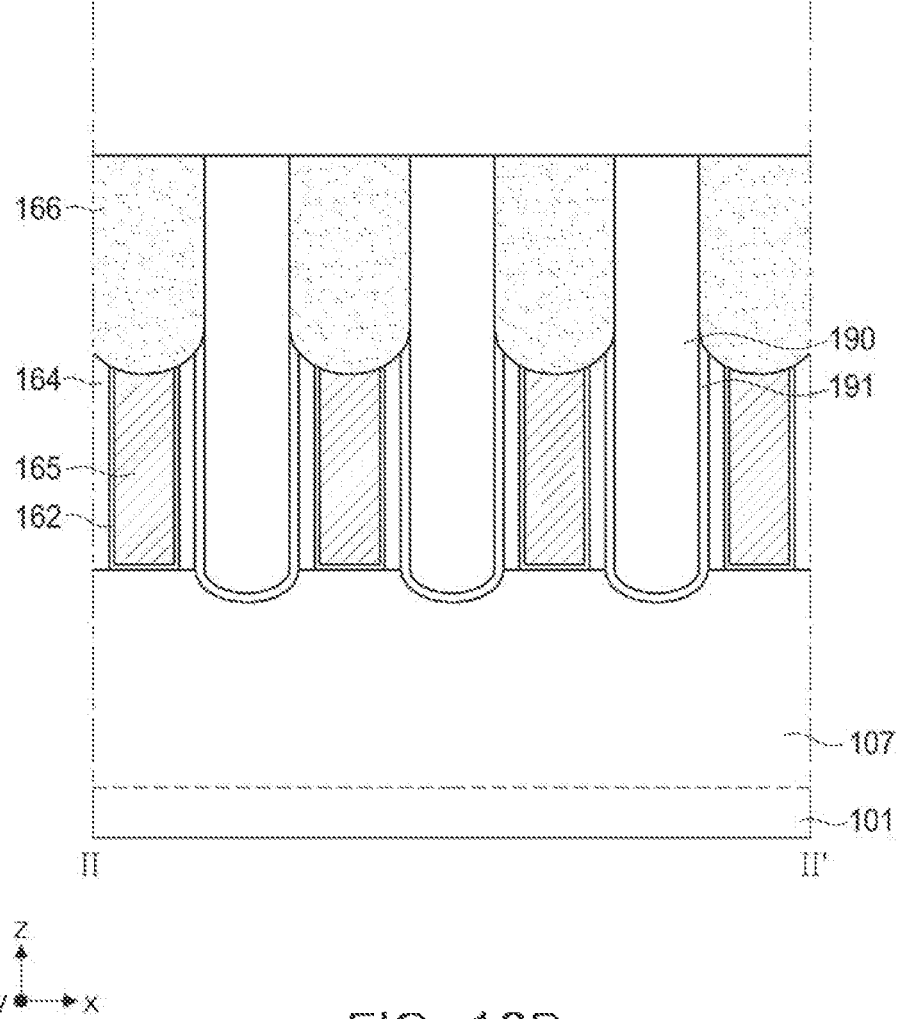
Figure 12C:
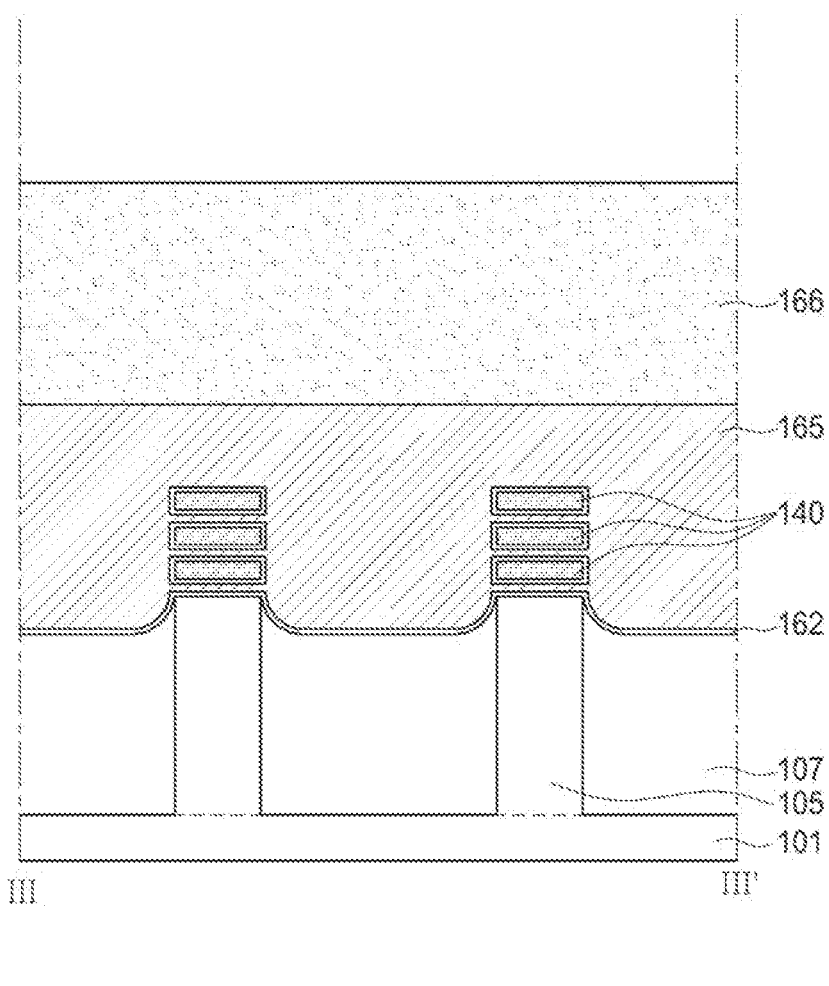
Figure 13:
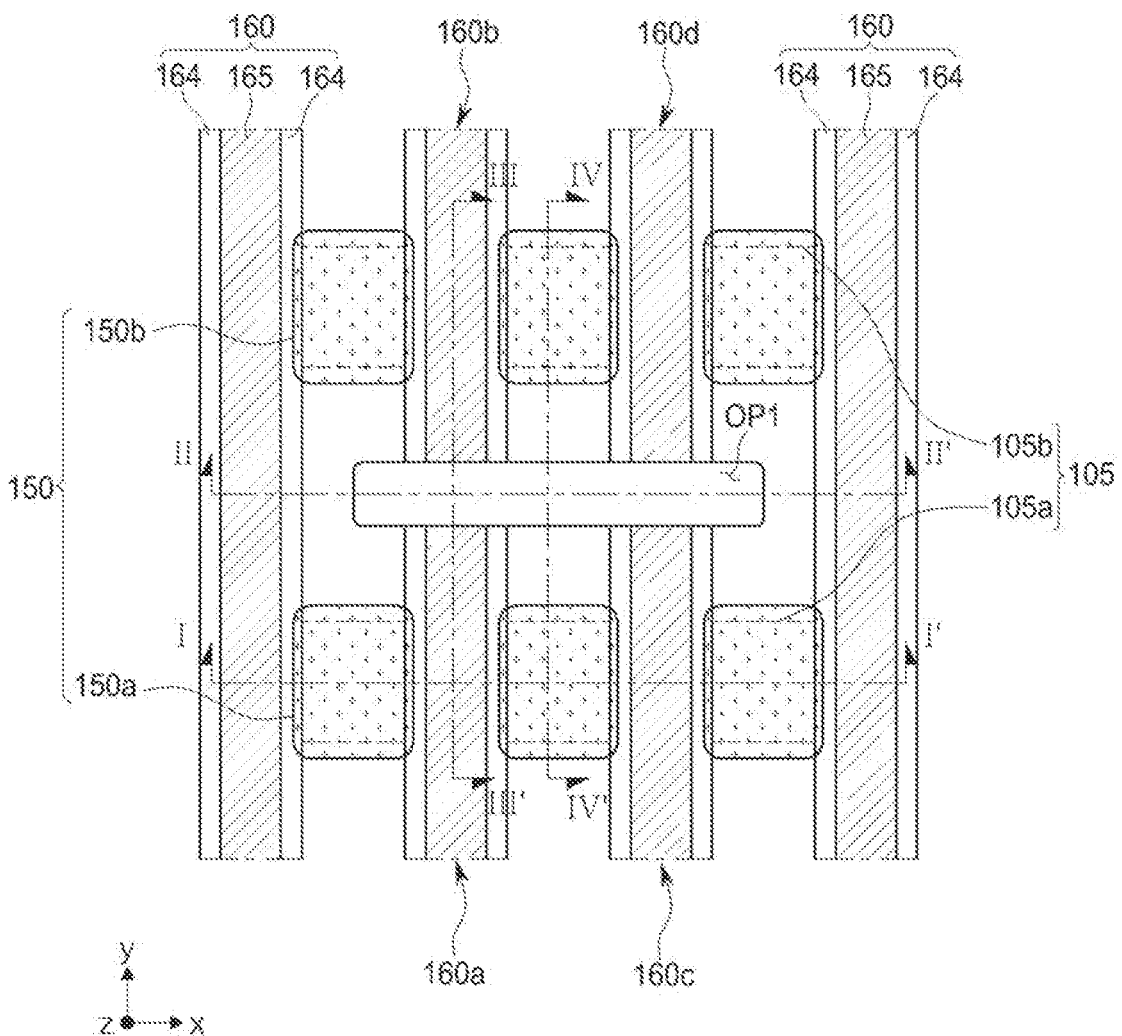
Figure 14A:
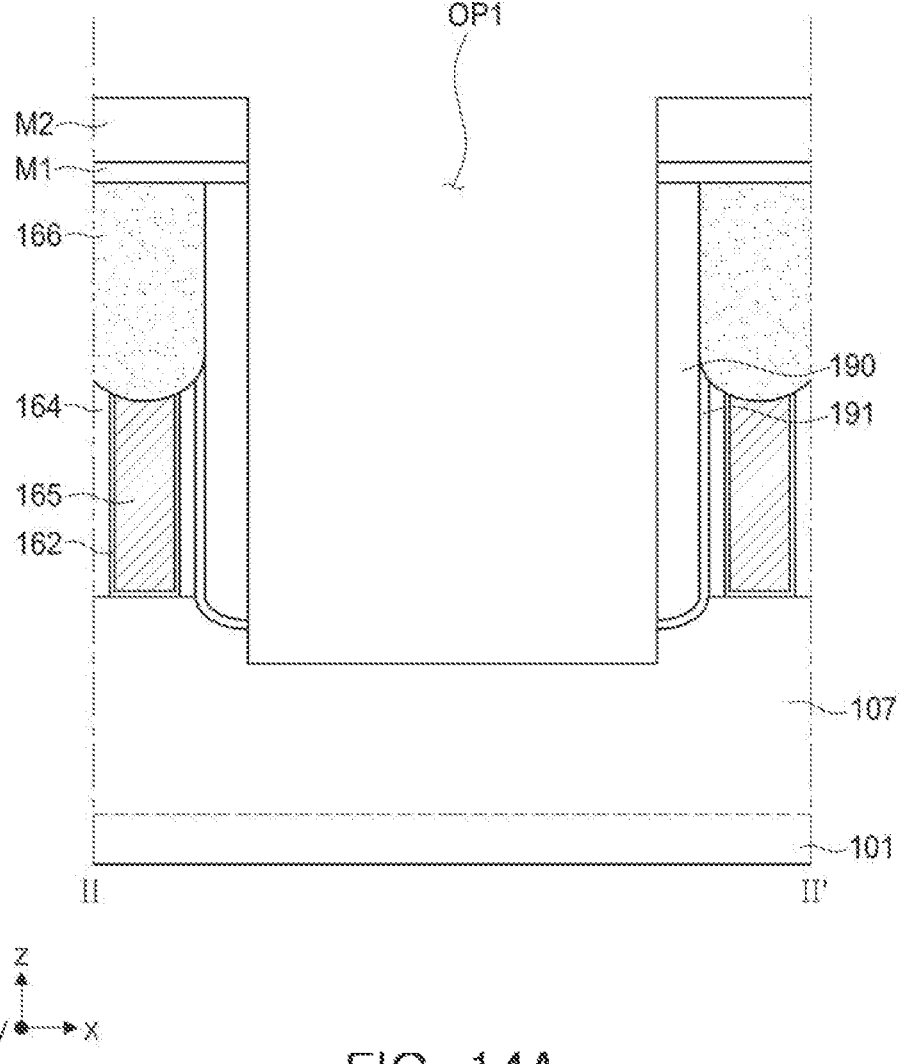
Figure 14B:
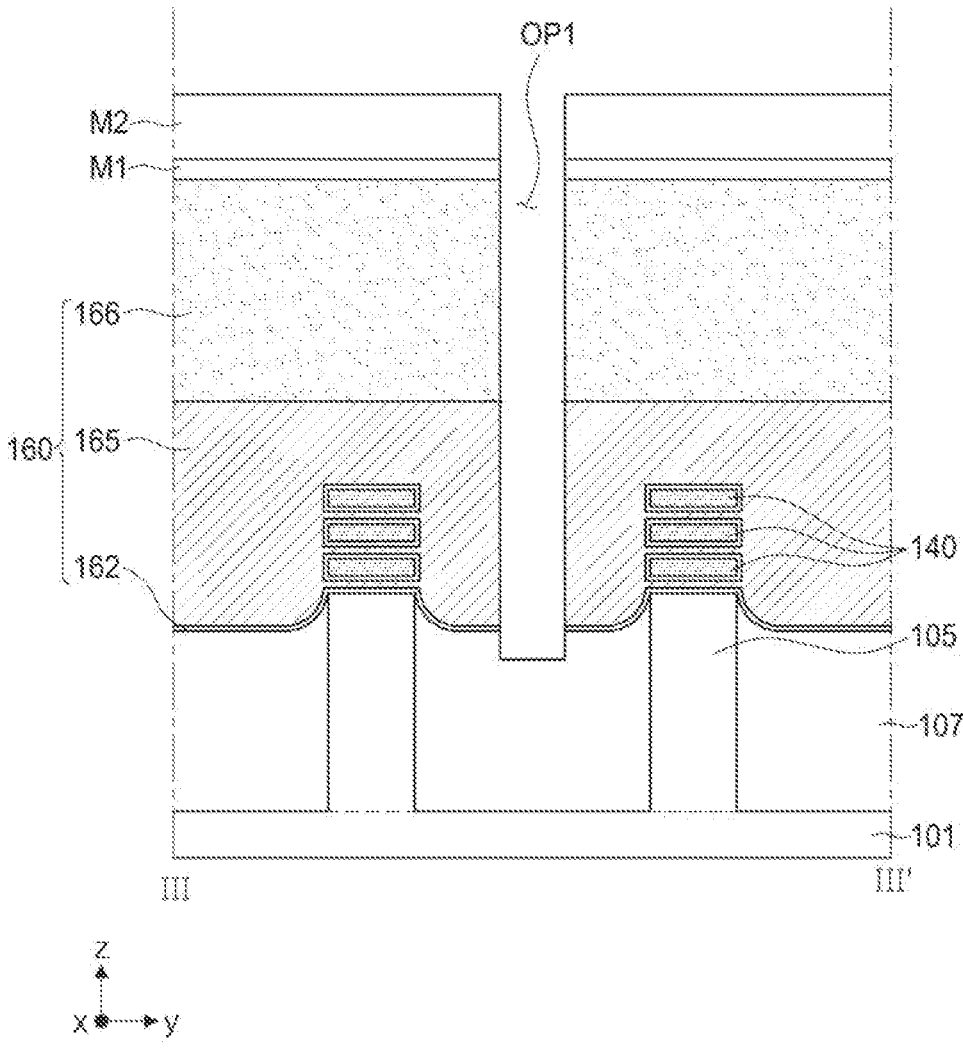
Figure 14C:
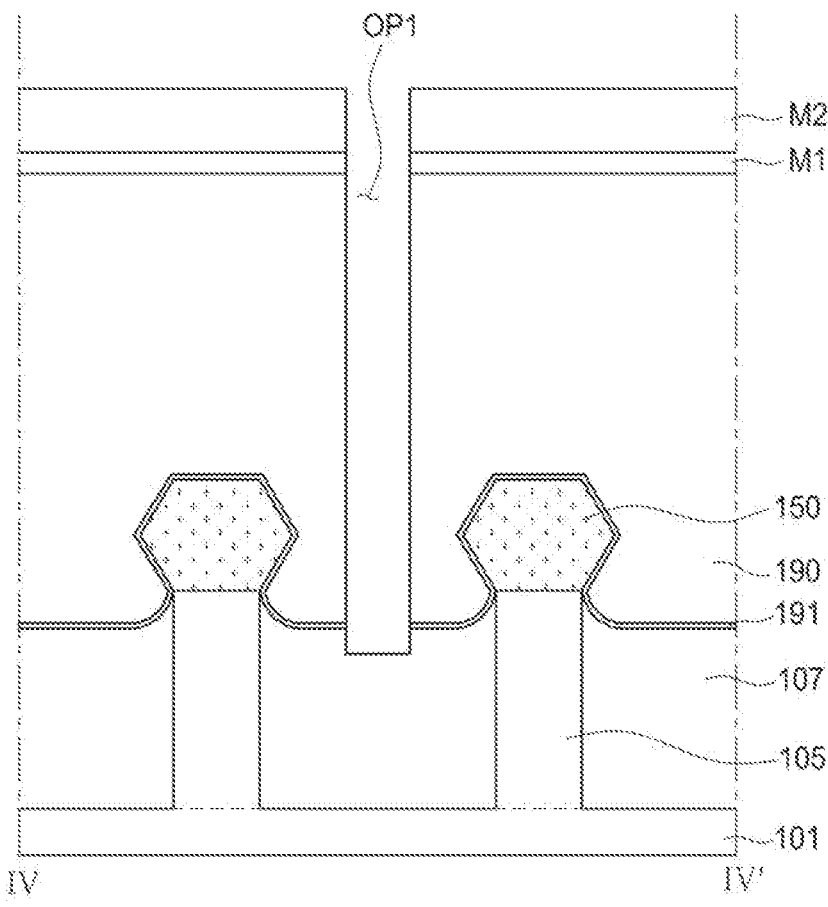
Figure 15:
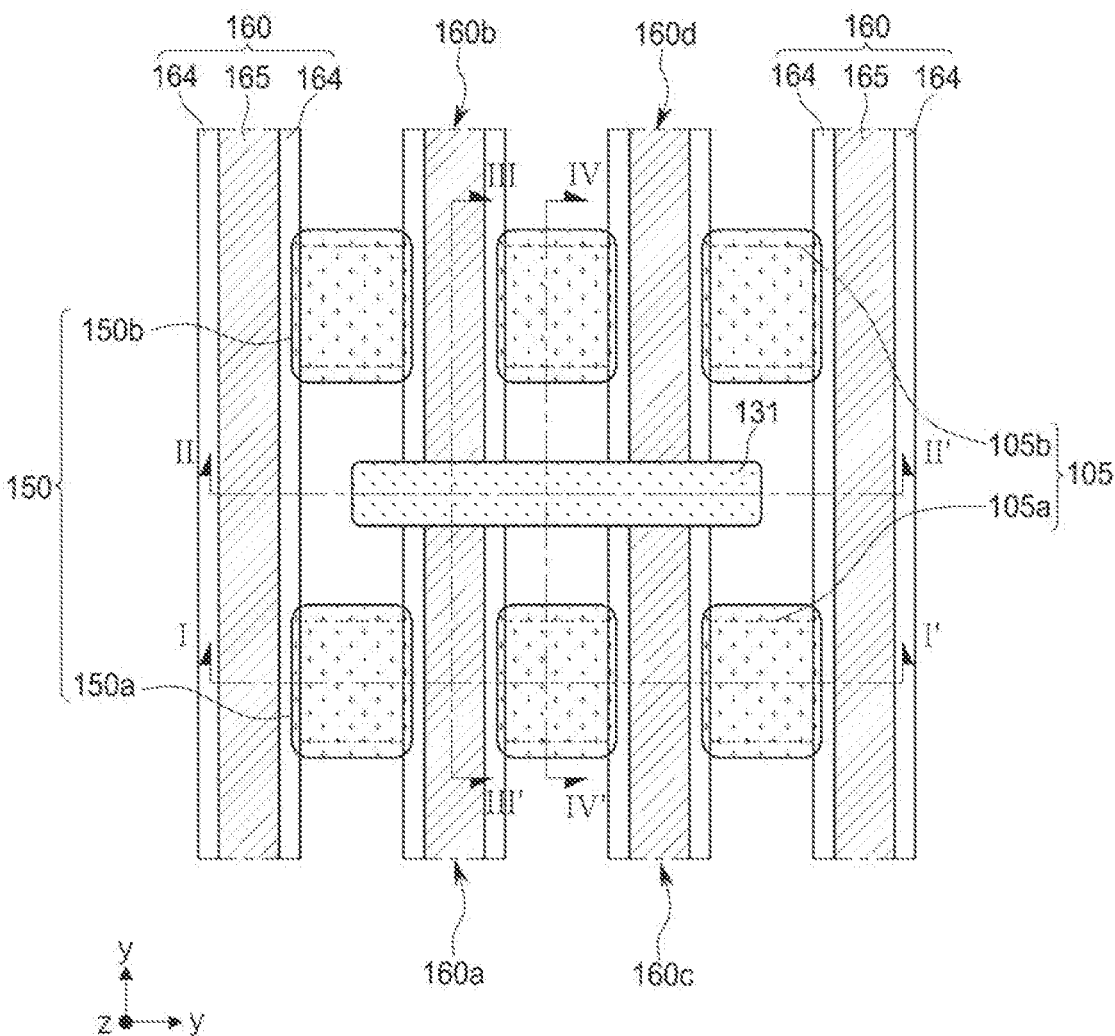
Figure 16A:
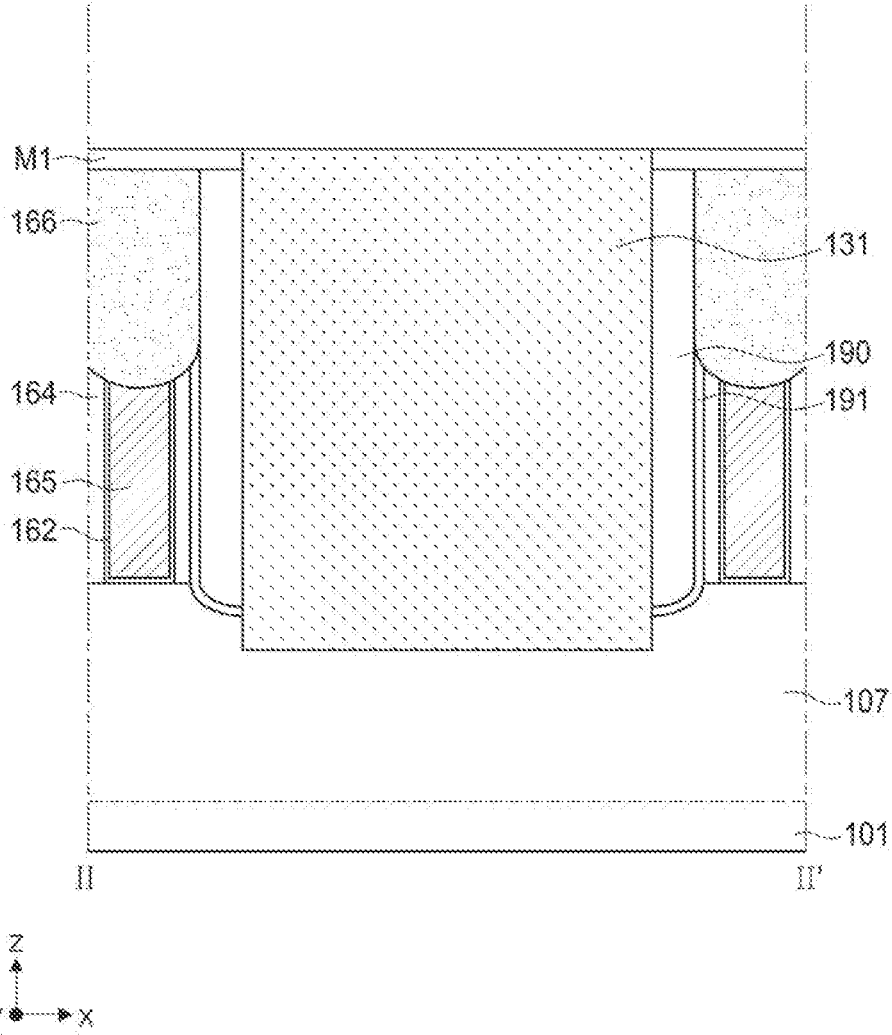
Figure 16B:
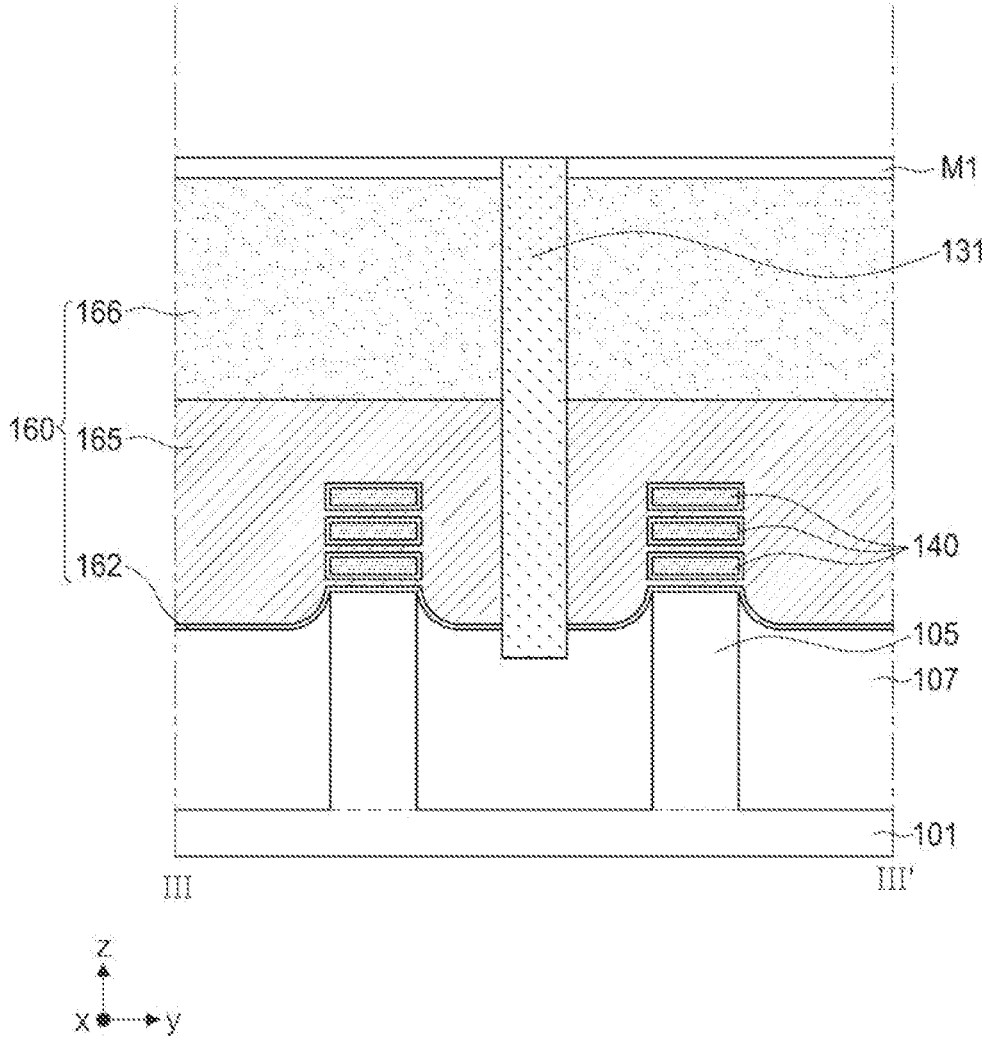
Figure 16C:
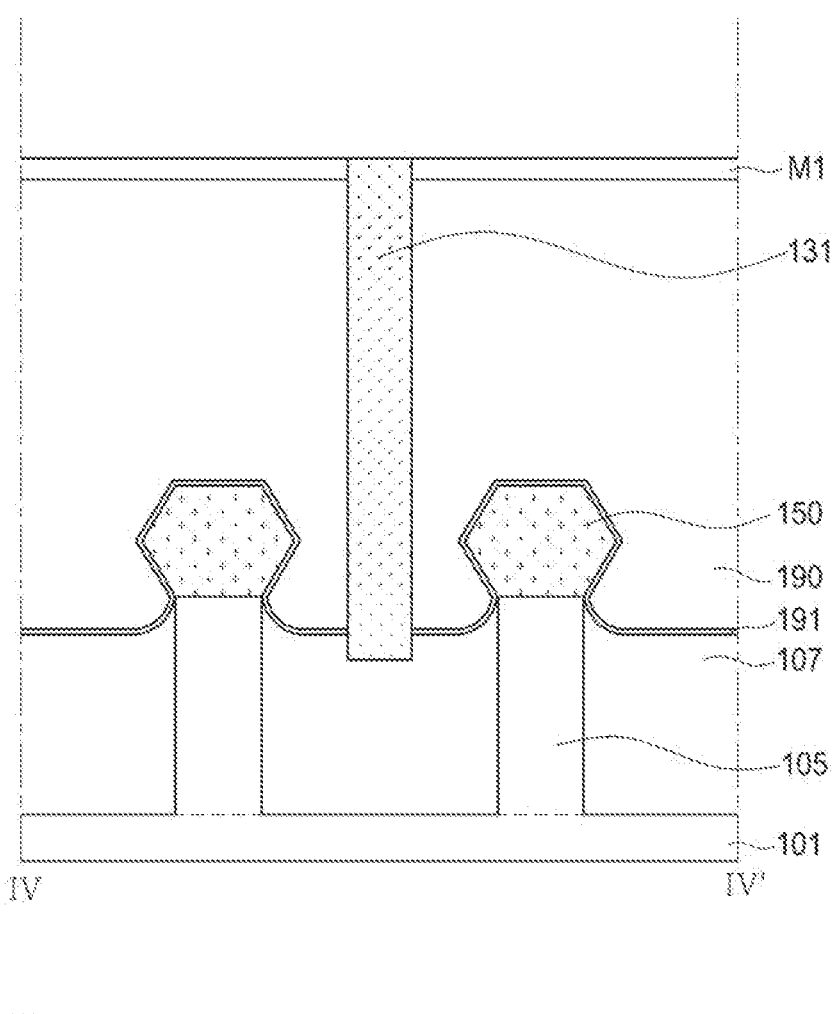

Referring to FIGS. 9A and 9B, the active regions 105 may be exposed by etching a portion of the sacrificial layers 111 and the channel layers 140 using the sacrificial gate structures SG and the spacer structure 164 as an etching mask, and the and source/drain regions 150 disposed on the exposed active regions 105 may be formed.

By removing the exposed sacrificial layers 111 and the channel layers 140 between the sacrificial gate structures SG, a recess portion may be formed and the active regions 105 may be exposed. A portion of the substrate 101 may be recessed by forming the recess portion deeply, but example embodiments are not limited thereto, and the recess portion may be formed to expose the upper surface of the substrate 101 without removing the substrate 101.

In this process, a portion may be further removed from the side surfaces of the sacrificial layers 111 exposed by the recess portion. The sacrificial layers exposed by the recess portion may be partially removed from the side surface in the X-direction by being selectively etched with respect to the channel layers 140 by, for example, a wet etching process. Thereafter, internal spacer layers may be formed in a region in which a portion of the side surfaces of the sacrificial layers 111 is removed. The internal spacer layers may include at least one of SiN, SiCN, SiOCN, SiBCN, and SiBN. The internal spacer layers may be formed of the same material as that of the spacer structure 164, but example embodiments are not limited thereto. However, in some example embodiments, the process of removing a portion of the sacrificial layers 111 and forming the internal spacer layers may not be performed.

The source/drain regions 150 may be formed on the active regions 105 on at least one side of the sacrificial gate structures SG and the spacer structure 164.

The source/drain regions 150 may be formed by performing an epitaxial growth process in the recess portion. The source/drain regions 150 may include impurities by, for example, in-situ doping.

Referring to FIGS. 10A, 10B, 10C, and 10D, an insulating liner 191 and an interlayer insulating layer 190 may be formed in sequence, and a planarization process may be performed until the sacrificial gate layer SGL is exposed.

The insulating liner 191 may cover the sacrificial gate structures SG, the spacer structure 164, the source drain regions 150, and the device isolation layers 107. The interlayer insulating layer 190 may cover the insulating liner 191. The interlayer insulating layer 190 may be formed of silicon oxide or a low dielectric material, and the insulating liner 191 may be formed of a material different from that of the interlayer insulating layer 190, such as, for example, silicon nitride or a silicon nitride-based insulating material. A portion of the spacer structure 164 and the sacrificial gate capping layer SGC may be removed through the planarization process.

Referring to FIGS. 11, 12A, 12B, and 12C, the sacrificial layers 111 and the sacrificial gate structures SG may be removed, and the gate dielectric layer 162, the gate electrode 165, and the lower capping layer 166 may be formed.

The sacrificial layers 111 and the sacrificial gate structures SG may be selectively removed with respect to the spacer structure 164, the interlayer insulating layer 190, and the channel layers 140. First, the upper gap regions may be formed by removing the sacrificial gate structures SG, and the lower gap regions may be formed by removing the sacrificial layers 111 exposed through the upper gap regions. For example, when the sacrificial layers 111 include silicon germanium (SiGe) and the channel layers 140 include silicon (Si), the sacrificial layers 111 may be selectively removed by performing a wet etching process using peracetic acid as an etchant.

A gate dielectric layer 162 and a gate electrode 165 may be formed in sequence in the upper gap region and the lower gap region. The gate dielectric layer 162 may be formed to conformally cover internal surfaces of the upper gap regions and the lower gap regions. The gate electrode 165 may be formed by completely filling the upper gap regions and the lower gap regions.

The level of the upper surface may be lowered by partially etching from the upper portion of the gate electrode 165 and the upper portion of the spacer structure 164 by a predetermined depth, an insulating material is filled in the space formed when the upper surface is lowered, and a planarization process may be performed, thereby forming a capping layer 166. The planarization process may be performed such that the upper surface of the interlayer insulating layer 190 may be exposed, but in example embodiments, a portion of the upper surface of the interlayer insulating layer 190 may be recessed. The capping layer 166 may be formed of silicon nitride or a silicon nitride-based insulating material.

Referring to FIGS. 13, 14A, 14B, and 14C, the first opening OP1 may be formed using masks M1 and M2.

The first opening OP1 penetrating through the gate structures 160 and the interlayer insulating layer 190 may be formed using the masks M1 and M2 including the line-type openings extending in the X-direction as etching masks. In some example embodiments, the first opening OP1 may be recessed into a portion of the device isolation layers 107 and may expose the device isolation layers 107. First and second gate structures 160a and 160b electrically isolated and physically spaced apart from each other by the first opening OP1 may be formed. Third and fourth gate structures 160c and 160d electrically isolated and physically spaced apart from each other by the first opening OP1 may be formed. In some example embodiments, the first opening OP1 may form two pairs of gate structures 160 opposing each other in the Y-direction, or alternatively, the first opening OP1 may form one pair or three or more pairs of gate structures 160 opposing each other in the Y-direction.

By forming the first opening OP1 having a line shape, electrical isolation between gate structures opposing in the Y-direction may be secured, thereby providing a semiconductor device having improved electrical properties.

Referring to FIGS. 15, 16A, 16B, and 16C, a first isolation structure 131 may be formed.

An insulating material may be deposited to cover the upper surfaces of the first opening OP1 and the second mask layer M2, and a portion the second mask layer M2 and the insulating material may be removed by performing a planarization process, thereby forming a first isolation structure 131 filling the first opening OP1. The insulating material may include, for example, silicon oxide.

Figure 17:
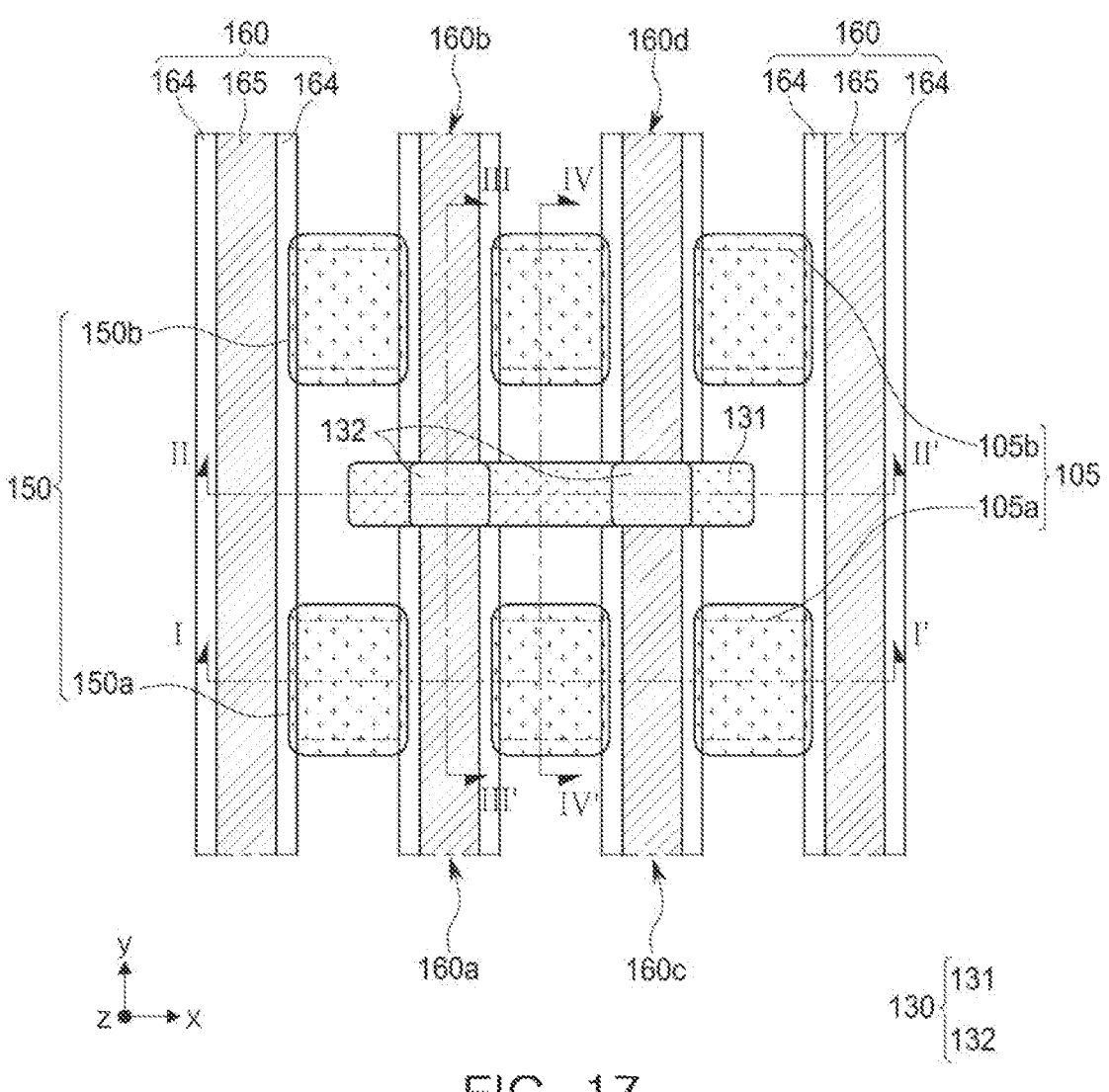
Figure 18A:
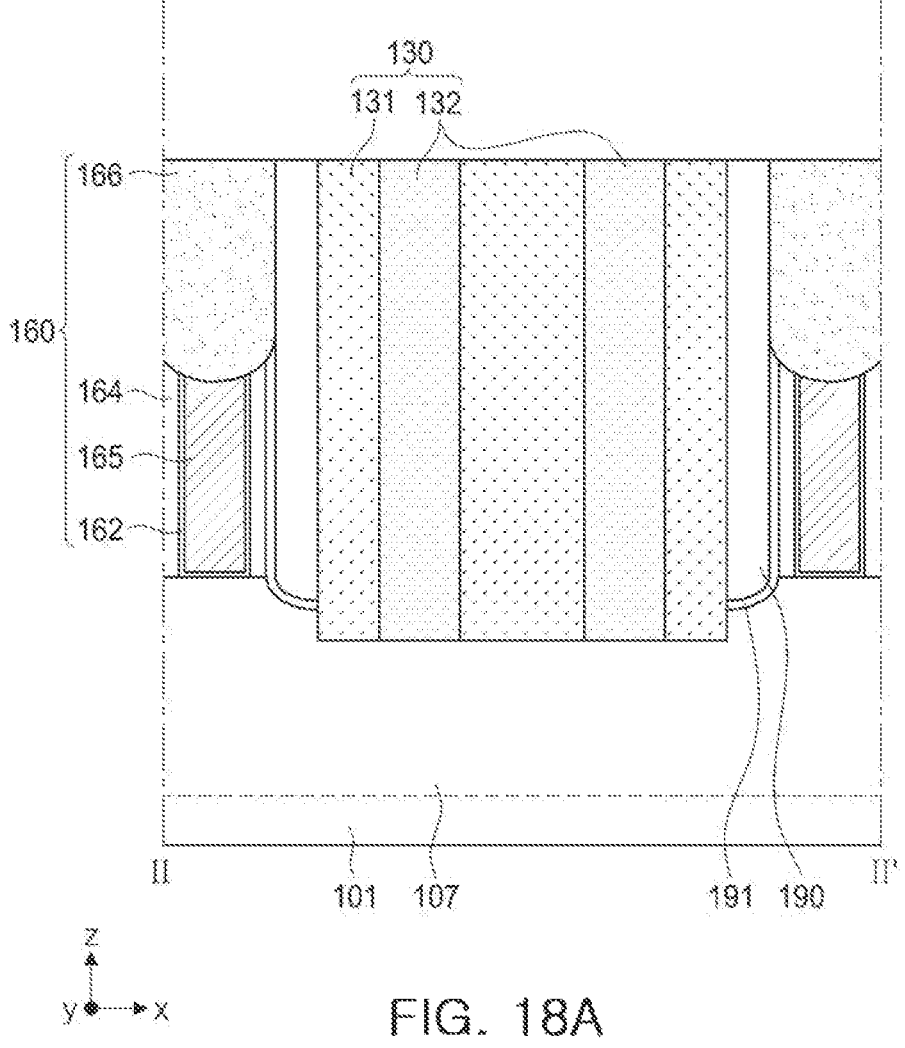
Figure 18B:
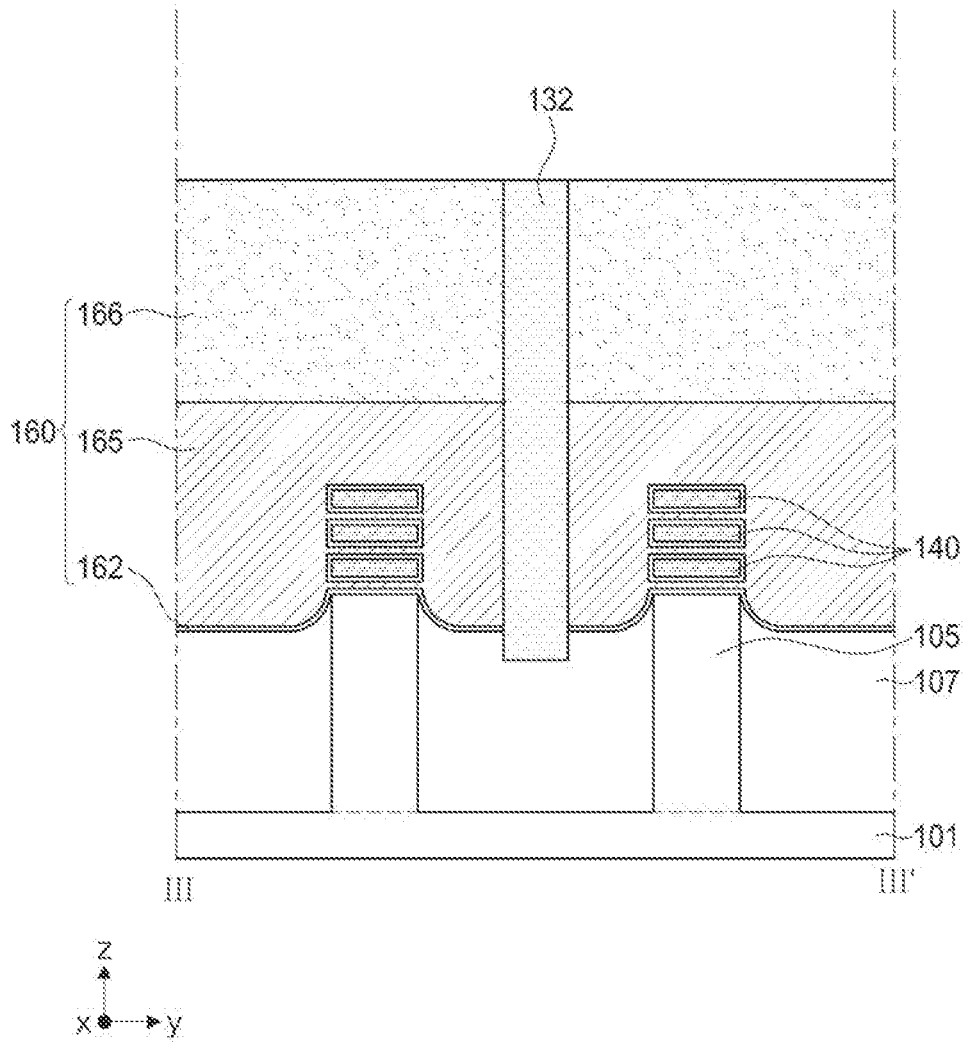

Referring to FIGS. 17, 18A, and 18B, second isolation structures 132 may be formed.

Hole-type second openings penetrating through the first isolation structure 131 may be formed between the first and second gate structures 160a and 160b and between the third and fourth gate structures 160c and 160d, an insulating material may be deposited in the hole-type second openings, a planarization process may be performed, thereby forming the second isolation structures 132. The insulating material may include, for example, silicon nitride.

Thereafter, referring to FIGS. 1 to 2D together, contact holes exposing the source/drain regions 150 may be formed, and by filling the contact holes with a conductive material, thereby forming contact plugs 170. In this process, by forming the first and second isolation structures 131 and 132 having different materials through a separate preceding process, electrical defects of the common contact plug 171 may be prevented. Electrical isolation of the gate structures opposing each other in the Y-direction may be secured and difficulty of forming a contact hole for forming the common contact plug 171 may be lowered using the oxide-based first isolation structure 131 having a line type. When the contact hole is formed using the nitride-based second isolation structures 132 having a hole-type, defects such as leakage current caused by exposure of the gate electrode 165 of the gate structures 160 may be prevented, and the contact hole may be self-aligned. Accordingly, a semiconductor device having improved electrical properties may be provided.

According to the aforementioned example embodiments, by forming the line-type first isolation structure and the hole-type second isolation structures, a semiconductor device having improved electrical properties in a highly integrated semiconductor device may be provided. Specifically, electrical isolation between the gate electrodes opposing each other may be obtained using the first isolation structure, and electrical isolation between common contact plugs may be prevented using the second isolation structures.

While the example embodiments have been illustrated and described above, it will be configured as apparent to those skilled in the art that modifications and variations could be made without departing from the scope of the present disclosure as defined by the appended claims.

What is claimed is:

1. A semiconductor device comprising:

active regions extending in a first horizontal direction and disposed parallel to each other on a substrate;

a plurality of gate structures extending in a second horizontal direction and intersecting the active regions on the substrate, the plurality of gate structures respectively including gate electrodes;

source/drain regions on the active regions on at least one side of the plurality of gate structures; and a gate isolation structure that isolates gate structures of the plurality of gate structures that oppose each other in the second horizontal direction, the gate isolation structure isolating the gate structures from each other on a region between the active regions, wherein the gate structures that oppose each other in the second horizontal direction include a first gate structure, a second gate structure opposing the first gate structure in the second horizontal direction, a third gate structure extending in parallel to the first gate structure, and a fourth gate structure opposing the third gate structure in the second horizontal direction and extending in parallel to the second gate structure, wherein the gate isolation structure includes:

a first isolation structure of a line type that extends in the first horizontal direction; and second isolation structures of a hole type that penetrate through the first isolation structure between the first gate structure and the second gate structure and between the third gate structure and the fourth gate structure, wherein the semiconductor device further includes a common contact plug including a first portion between the first gate structure and the third gate structure, a second portion between the second isolation structures, and a third portion between the second gate structure and the fourth gate structure, and wherein the second portion has an outwardly curved shape that is curved toward the second isolation structures on a plane.

2. The semiconductor device of claim 1, wherein the second isolation structures include a first vertical pillar that physically isolates the gate electrodes of the first gate structure and the second gate structure from each other and a second vertical pillar that physically isolates the gate electrodes of the third gate structure and the fourth gate structure from each other.

3. The semiconductor device of claim 2, wherein the first vertical pillar completely overlaps the first gate structure and the second gate structure in the second horizontal direction, and the second vertical pillar completely overlaps the third gate structure and the fourth gate structure in the second horizontal direction.

4. The semiconductor device of claim 1, wherein a width of each of the second isolation structures in the first horizontal direction is narrower than a width of each of the gate structures in the first horizontal direction and is larger than a width of a corresponding gate electrode in the first horizontal direction.

5. The semiconductor device of claim 1, further comprising:
an interlayer insulating layer covering the source/drain regions on the substrate and covering side surfaces of the gate structures,
wherein a material of the first isolation structure includes a same material as a material of the interlayer insulating layer.

6. The semiconductor device of claim 1,
wherein the first isolation structure includes silicon oxide, and
wherein the second isolation structures include silicon nitride.

7. The semiconductor device of claim 1, wherein the first isolation structure includes a gap-fill insulating layer, and a barrier layer that cover side surfaces and a bottom surface of the gap-fill insulating layer.

8. The semiconductor device of claim 1, further comprising:
contact plugs connected to the source/drain regions,
wherein the active regions include a first active region and a second active region adjacent to each other,
wherein the source/drain regions include a first source/drain region on the first active region and a second source/drain region on the second active region, and
wherein the contact plugs include the common contact plug connected to the first source/drain region and the second source/drain region.

9. The semiconductor device of claim 8,
wherein a width of the second portion in the first horizontal direction is greater than a width of the first portion in the first horizontal direction or a width of the third portion in the first horizontal direction.

10. The semiconductor device of claim 1, wherein a lower surface of the gate isolation structure is on a level lower than a level of a lower surface of each of the gate structures.

11. The semiconductor device of claim 10, wherein a lower surface of each of the second isolation structures is on a level lower than a level of a lower surface of the first isolation structure.

12. A semiconductor device comprising:
active regions extending in a first horizontal direction and disposed parallel to each other on a substrate;
a plurality of gate structures intersecting the active regions on the substrate, extending in a second horizontal direction, and including gate electrodes;
source/drain regions on the active regions on at least one side of the plurality of gate structures;
an interlayer insulating layer covering the source/drain regions on the substrate and covering side surfaces of the plurality of gate structures;
contact plugs penetrating through the interlayer insulating layer and connected to the source/drain regions; and
a gate isolation structure disposed between the active regions and isolating gate structures of the plurality of gate structures that oppose each other in the second horizontal direction, the gate isolation structure isolating the gate structures that oppose each other from each other,
wherein the gate structures that oppose each other include a first gate structure, a second gate structure opposing the first gate structure in the second horizontal direction, a third gate structure extending in parallel to the first gate structure, and a fourth gate structure opposing the third gate structure in the second horizontal direction and extending in parallel to the second gate structure, and
wherein the gate isolation structure includes:
a first isolation structure of a line type that extends in the first horizontal direction; and
second isolation structures of a hole-type that penetrate through the first isolation structure between the first gate structure and the second gate structure and between the third gate structure and the fourth gate structure,
wherein a common contact plug, among the contact plugs, includes a first portion between the first gate structure and the third gate structure, a second portion between the second isolation structures, and a third portion between the second gate structure and the fourth gate structure,
wherein each of the first portion and the third portion is connected to the source/drain regions, and
wherein a width of the second portion in the first horizontal direction is greater than a width of the first portion in the first horizontal direction or a width of the third portion in the first horizontal direction.

13. The semiconductor device of claim 12,
wherein the second portion penetrates the first isolation structure, and
wherein at least a portion of side surfaces of the second portion are in contact with the second isolation structures.

14. The semiconductor device of claim 12, wherein levels of lower surfaces of the first portion and the third portion are on a level higher than a level of a lower surface of the second portion.

15. The semiconductor device of claim 12,
wherein the first isolation structure includes:
a gap-fill insulating layer including silicon oxide; and
a barrier layer including at least one of silicon carbonate, silicon nitride, or polycrystalline silicon, and covering side surfaces and a bottom surface of the gap-fill insulating layer, and
wherein the second isolation structures include silicon nitride.

16. A semiconductor device comprising:
active regions extending in a first horizontal direction and disposed parallel to each other on a substrate;
a first gate structure and a second gate structure that are spaced apart from each other in a second horizontal direction and that intersect the active regions on the substrate, each of the first gate structure and the second gate structure including a gate electrode and spacer structures extending in the second horizontal direction along both sides of the gate electrode;
an interlayer insulating layer covering side surfaces of the first gate structure and the second gate structure; and
a gate isolation structure between the active regions, the gate isolation structure isolating the first gate structure and the second gate structure from each other,
wherein the gate isolation structure includes:
a first isolation structure of a line type that extends in the first horizontal direction; and
a second isolation structure of a hole type that penetrates through the first isolation structure between the first gate structure and the second gate structure,
wherein the first isolation structure includes a material different from a material of the second isolation structure, wherein a width of the second isolation structure in the first horizontal direction is narrower than a width of each of the first gate structure and the second gate structure in the first horizontal direction, and the second isolation structure is spaced apart from the interlayer insulating layer.

17. The semiconductor device of claim 16, wherein the width of the second isolation structure in the first horizontal direction is greater than a width of the gate electrode, and is smaller than a sum of the width of the gate electrode and widths of the spacer structures disposed on both sides of the gate electrode in the first horizontal direction.

18. The semiconductor device of claim 1, wherein a material of the first isolation structure is not included in the second isolation structures.

19. The semiconductor device of claim 12, wherein a material of the first isolation structure is not included in the second isolation structures.

20. The semiconductor device of claim 16, wherein a material of the first isolation structure is not included in the second isolation structure.

* * * * *